(12) United States Patent
Lee et al.

(10) Patent No.: US 8,385,250 B2
(45) Date of Patent: Feb. 26, 2013

(54) DIGITAL BROADCASTING SYSTEM AND DATA PROCESSING METHOD IN THE DIGITAL BROADCASTING SYSTEM

(75) Inventors: Chul Soo Lee, Seoul (KR); In Hwan Choi, Gyeonggi-do (KR); Jae Hyung Song, Seoul (KR); Seung Jong Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 324 days.

(21) Appl. No.: 12/820,031

(22) Filed: Jun. 21, 2010

(65) Prior Publication Data
US 2010/0254318 A1 Oct. 7, 2010

Related U.S. Application Data

(63) Continuation of application No. 12/234,915, filed on Sep. 22, 2008, now Pat. No. 8,089,929.

(60) Provisional application No. 60/974,084, filed on Sep. 21, 2007, provisional application No. 60/977,379, filed on Oct. 4, 2007, provisional application No. 61/044,504, filed on Apr. 13, 2008, provisional application No. 61/076,686, filed on Jun. 29, 2008, provisional application No. 61/081,729, filed on Jul. 17, 2008.

(30) Foreign Application Priority Data

Sep. 19, 2008 (KR) .................. 10-2008-0092423

(51) Int. Cl.
| H04H 20/71 | (2008.01) |
| H04W 4/00 | (2009.01) |
| H04J 3/00 | (2006.01) |
| H04B 7/212 | (2006.01) |
| H03C 1/52 | (2006.01) |
| H04L 27/10 | (2006.01) |

(52) U.S. Cl. ........ 370/312; 370/330; 370/336; 370/347; 375/270; 375/277

(58) Field of Classification Search .......... 370/204–206, 370/229, 234, 249, 252, 312, 314, 321, 330, 370/332, 335–338, 346–347; 375/270, 277, 375/295–301, 316–322
See application file for complete search history.

(56) References Cited

U.S. PATENT DOCUMENTS
(Continued)

FOREIGN PATENT DOCUMENTS
| JP | 2003032640 | 1/2003 |
| KR | 10-1998-0023115 | 7/1998 |

(Continued)

OTHER PUBLICATIONS

ETSI "Digital Video Broadcasting (DVB); DVB-H Implementation Guidelines" ETSI TR 102 377 v1.2.1, Nov. 2005.

(Continued)

*Primary Examiner* — Tri H Phan
(74) *Attorney, Agent, or Firm* — Lee, Hong, Degerman, Kang & Waimey

(57) ABSTRACT

A digital broadcasting system and a data processing method are disclosed. In an aspect of the present invention, the present invention provides a data processing method including receiving a broadcast signal in which main service data and mobile service data are multiplexed, demodulating the received broadcast signal, outputting demodulation time information of a specific position of a broadcast signal frame, and acquiring reference time information contained in the mobile service data frame, setting the reference time information to a system time clock at a specific time based on the demodulation time information and decoding the mobile service data according to the system time clock.

9 Claims, 25 Drawing Sheets

U.S. PATENT DOCUMENTS

| | | | |
|---|---|---|---|
| 5,619,386 | A | 4/1997 | Voorman et al. |
| 6,775,800 | B2 | 8/2004 | Edmonston et al. |
| 7,801,181 | B2 | 9/2010 | Song et al. |
| 7,948,943 | B2 * | 5/2011 | Song et al. .................... 370/329 |
| 8,051,451 | B2 * | 11/2011 | Song et al. ...................... 725/62 |
| 8,089,929 | B2 * | 1/2012 | Lee et al. ..................... 370/329 |
| 8,098,646 | B2 * | 1/2012 | Song et al. .................... 370/349 |
| 8,116,276 | B2 * | 2/2012 | Lee et al. ..................... 370/329 |
| 8,149,754 | B2 * | 4/2012 | Song et al. .................... 370/312 |
| 8,199,830 | B2 * | 6/2012 | Lee et al. ................. 375/240.25 |
| 2004/0081199 | A1 | 4/2004 | Lopez et al. |
| 2005/0060760 | A1 | 3/2005 | Jaffe et al. |
| 2006/0194536 | A1 | 8/2006 | Kim et al. |
| 2007/0003217 | A1 | 1/2007 | Jang |
| 2008/0225799 | A1 | 9/2008 | Lee et al. |
| 2008/0239161 | A1 | 10/2008 | Kim et al. |
| 2008/0240065 | A1 | 10/2008 | Choi et al. |
| 2008/0240293 | A1 | 10/2008 | Kim et al. |
| 2008/0240297 | A1 | 10/2008 | Kim et al. |
| 2008/0246881 | A1 | 10/2008 | Kim et al. |
| 2008/0246887 | A1 | 10/2008 | Lee et al. |
| 2009/0028081 | A1 | 1/2009 | Song et al. |
| 2009/0028272 | A1 | 1/2009 | Song et al. |
| 2009/0052581 | A1 * | 2/2009 | Song et al. .................... 375/316 |
| 2009/0060030 | A1 * | 3/2009 | Song et al. ............... 375/240.01 |
| 2009/0080405 | A1 | 3/2009 | Lee et al. |
| 2009/0252253 | A1 | 10/2009 | Choi et al. |
| 2009/0260041 | A1 | 10/2009 | McGinn et al. |
| 2010/0257570 | A1 * | 10/2010 | Song et al. .................... 725/110 |

FOREIGN PATENT DOCUMENTS

| | | |
|---|---|---|
| KR | 10-2004-0013153 | 2/2004 |
| KR | 1020050041489 | 5/2005 |
| KR | 10-2005-0062867 | 6/2005 |
| KR | 10-2005-0093921 | 9/2005 |
| KR | 10-2006-0017695 | 2/2006 |
| KR | 1020060065435 | 6/2006 |
| KR | 10-2006-0095235 | 8/2006 |
| KR | 10-2007-0034215 | 3/2007 |
| KR | 10-2007-0079328 | 8/2007 |
| WO | 2007/089108 | 8/2007 |
| WO | 2009/038402 | 3/2009 |
| WO | 2009/038405 | 3/2009 |

OTHER PUBLICATIONS

ATSC Standard "Program and System Information Protocol for Terrestrial Broadcast and Cable (Revision B)" A/65B, Mar. 18, 2003.

DVB Document A092 Rev. 2 (Draft v. 1.3.1), DVB-H Implementation Guidelines, May 2007, all pages, (www.dvb-h.org).

ETSI TS 102 470 V1.1.1, Digital Video Broadcasting (DVB); IP Datacast over DVB-H: Program Specific Information (PSI)/Service Information (SI), Apr. 2006, all pages.

OMA-TS-BCAST_SERVICES-V1_0-20070529-C, Mobile Broadcast Services Candidate Version 1.0, May 29, 2007, all pages.

ETSI EN 300 401 V1.4.1, Radio Broadcasting Systems; Digital Audio Broadcasting (DAB) to Mobile, Portable and Fixed Receivers; Jun. 2006.

* cited by examiner

- First MH Header indicating the MH payload contains signaling data
- Second MH Header indicating the MH payload contains signaling data and service data
- Third MH Header indicating the MH payload contains service data
- Signaling data payload
- IP Datagram 1
- IP Datagram 2

FIG. 15

| Syntax | # of bits |
|---|---|
| FIC_Segment () { | |
|   FIC_type | 2 |
|   Reserved | 5 |
|   error_indicator | 1 |
|   FIC_seg_number | 4 |
|   FIC_last_seg_number | 4 |
|   for (i=0:i<N:i++) { | |
|     data_byte | 8 |
|   } | |
| } | |

FIG. 16

| | Syntax | # of bits |
|---|---|---|
| A first region { | if (FIC_seg_number == 0) { | |
| |   current_next_indicator | 1 |
| |   Reserved | 2 |
| |   ESG_version | 5 |
| |   transport_stream_id | 16 |
| | } | |
| A second region { | while ( ensemble_id != 0xFF ) | |
| |   ensemble id | 8 |
| |   reserved | 3 |
| |   SI_version | 5 |
| |   num_channel | 3 |
| A third region { |   for (i=0:i< num_channel:i++) { | |
| |     channel_type | 5 |
| |     channel_activity | 2 |
| |     CA_indicator | 1 |
| |     Stand_alone_Service_indtcator | |
| |     major_channel_num | 8 |
| |     minor_channel_num | 8 |
| |   } | |
| | } // end of while | |
| | } | |

FIG. 17

| Syntax | No. of Bits | Format |
|---|---|---|
| service_map_table_section() { | | |
|   table_id | 8 | TBD |
|   section_syntax_indicator | 1 | '0' |
|   private_indicator | 1 | '1' |
|   reserved | 2 | '11' |
|   section_length | 12 | uimsbf |
|   reserved | 3 | '111' |
|   version_number | 5 | uimsbf |
|   section_number | 8 | uimsbf |
|   last_section_number | 8 | uimsbf |
|   SMT_protocol_version | 8 | uimsbf |
|   ensemble_id | 8 | uimsbf |
|   num_channels | 8 | uimsbf |
|   for (i=0; i<num_channels; i++) | | |
|   { | | |
|     major_channel_number | 8 | uimsbf |
|     minor_channel_number | 8 | uimsbf |
|     short_channel_name | 8*8 | |
|     service_id | 16 | uimsbf |
|     service_type | 6 | uimsbf |
|     virtual_channel_activity | 2 | uimsbf |
|     num_components | 5 | uimsbf |
|     IP_version_flag | 1 | bslbf |
|     source_IP_address_flag | 1 | bslbf |
|     virtual_channel_target_IP_address_flag | 1 | bslbf |
|     if (source_IP_address_flag) | | |
|       source_IP_address | 32 or 128 | uimsbf |
|     if (virtual_channel_target_IP_address_flag) | | |
|       virtual_channel_target_IP_address | 32 or 128 | uimsbf |
|     for (j=0; j<num_components; j++) | | |
|     { | | |
|       RTP_payload_type | 7 | uimsbf |
|       component_target_IP_address_flag | 1 | bslbf |
|       if (component_target_IP_address_flag) | | |
|         component_target_IP_address | 32 or 128 | uimsbf |
|       reserved | 2 | '11' |
|       port_num_count | 6 | uimsbf |
|       target_UDP_port_num | 16 | uimsbf |
|       descriptors_length | 8 | uimsbf |
|       for (k=0; k<descriptors_length; k++) | | |
|       { | | |
|         component_level_descriptor() | | |
|       } | | |
|     } | | |
|     descriptors_length | 8 | uimsbf |
|     for (m=0; m<descriptors_length; m++) | | |
|     { | | |
|       virtual_channel_level_descriptor() | | |
|     } | | |
|   } | | |
|   descriptors_length | 8 | uimsbf |
|   for (n=0; n<descriptors_length; n++) { | | |
|   { | | |
|     ensemble_level_descriptor() | | |
|   } ensemble_level_descriptor() | | |
| } | | |

FIG. 18

| Syntax | No. of Bits | Format |
|---|---|---|
| MH_audio_descriptor() {<br>    descriptor_tag<br>    descriptor_length<br>    channel_configuration<br>    reserved<br>    sample_rate_code<br>    reserved<br>    bit_rate_code<br>    ISO_639_language_code<br>} | <br>8<br>8<br>8<br>5<br>3<br>2<br>6<br>3*8 | <br>TBD<br>uimsbf<br>uimsbf<br>'11111'<br>uimsbf<br>'11'<br>uimsbf<br>uimsbf |

FIG. 19

| Syntax | No. of Bits | Format |
|---|---|---|
| MH_RTP_payload_type_descriptor() {<br>    descriptor_tag<br>    descriptor_length<br>    reserved<br>    RTP_payload_type<br>    MIME_type_length<br>    MIME_type()<br>} | <br>8<br>8<br>1<br>7<br>8<br>var | <br>TBD<br>uimsbf<br>'1'<br>uimsbf<br>uimsbf |

FIG. 20

| Syntax | No. of Bits | Format |
|---|---|---|
| MH_current_event_descriptor() {<br>    descriptor_tag<br>    descriptor_length<br>    current_event_start_time<br>    current_event_duration<br>    Title_length<br>    Title_text()<br>} | <br>8<br>8<br>4*8<br>3*8<br>8<br>var | <br>TBD<br>uimsbf<br>uimsbf<br>uimsbf<br>uimsbf |

FIG. 21

| Syntax | No. of Bits | Format |
|---|---|---|
| MH_next_event_descriptor() {<br>    descriptor_tag<br>    descriptor_length<br>    next_event_start_time<br>    next_event_duration<br>    title_length<br>    title_text()<br>} | <br>8<br>8<br>4*8<br>3*8<br>8<br>var | <br>TBD<br>uimsbf<br>uimsbf<br>uimsbf<br>uimsbf |

FIG. 22

| Syntax | No. of Bits | Format |
|---|---|---|
| MH_system_time_descriptor() {<br>    descriptor_tag<br>    descriptor_length<br>    system_time<br>    GPS_UTC_offset<br>    time_zone_offset_polarity_rate_code<br>    time_zone_offset<br>    daylight_savings()<br>    time_zone()<br>} | <br>8<br>8<br>32<br>8<br>1<br>31<br>16<br>5*8 | <br>TBD<br>uimsbf<br>uimsbf<br>uimsbf<br>bslbf<br>uimsbf<br>uimsbf |

DIGITAL BROADCASTING SYSTEM AND DATA PROCESSING METHOD IN THE DIGITAL BROADCASTING SYSTEM

This application is a continuation of U.S. patent application Ser. No. 12/234,915 filed on Sep. 22, 2008, now U.S. Pat. No. 8,089,929, which claims the benefit of and right of priority to Korean Patent Application No. 10-2008-0092423, filed on Sep. 19, 2008, and also claims the benefit of and right of priority to U.S. Provisional Application No. 60/974,084, filed on Sep. 21, 2007, U.S. Provisional Application No. 60/977,379, filed on Oct. 4, 2007, U.S. Provisional Application No. 61/044,504, filed on Apr. 13, 2008, U.S. Provisional Application No. 61/076,686, filed on Jun. 29, 2008, and U.S. Provisional Application No. 61/081,729, filed on Jul. 17, 2008, the contents of all of which are hereby incorporated by reference herein in their entireties.

BACKGROUND OF THE INVENTION

1. Field of the Invention

The present invention relates to a digital broadcasting system, and more particularly, to a digital broadcasting system and a data processing method.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a digital broadcasting system and a data processing method that substantially obviates one or more problems due to limitations and disadvantages of the related art.

An object of the present invention is to provide a digital broadcasting system and a data processing method that are highly resistant to channel changes and noise.

An object of the present invention is to provide a digital broadcasting system and a method of processing data in a digital broadcasting system that can enhance the receiving performance of a receiving system (or receiver) by having a transmitting system (or transmitter) perform additional encoding on mobile service data.

Another object of the present invention is to provide a digital broadcasting system and a method of processing data in the digital broadcasting system that can also enhance the receiving performance of a digital broadcast receiving system by inserting known data already known in accordance with a pre-agreement between the receiving system and the transmitting system in a predetermined region within a data region.

Another object of the present invention is to provide a digital broadcast system and a data processing method which can process service data discontinuously received on a time axis at a constant bit rate.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a data processing method includes receiving a broadcast signal in which main service data and mobile service data are multiplexed, demodulating the received broadcast signal, outputting demodulation time information of a specific position of a broadcast signal frame, and acquiring reference time information contained in the mobile service data frame, setting the reference time information to a system time clock at a specific time based on the demodulation time information and decoding the mobile service data according to the system time clock.

The reference time information may be a network time protocol (NTP) timestamp. The demodulation time information may include either one of the frame starting point and the frame end point of the broadcast signal. The manager set the reference time information to the system time clock at interval of 968 milliseconds.

The broadcast signal includes a data group in which the mobile service data error-correction-encoded by at least one of code rates, and the mobile service data in the interleaved data group includes periodically-inserted known data.

In another aspect of the present invention, a digital broadcast system includes a receiver configured to receive a broadcast signal in which main service data and mobile service data are multiplexed, a demodulator configured to demodulate the received broadcast signal, output demodulation time information of a specific position of a broadcast signal frame, and output a mobile service data frame from the demodulated broadcast signal, a mobile service data frame decoder configured to decoding the mobile service data frame and output a transport packet, a transport packet (TP) handler configured to output reference time information contained in the transport packet, a manager configured to set the outputted reference time information to a system time clock at a specific time based on the demodulation time information, a decoder configured to decode the mobile service data according to the system time clock and a display configured to display contents contained in the decoded mobile service data.

The digital broadcast system may further include a buffer for temporarily storing mobile service data contained in the transport packet according to the system time clock. The manager may control the display for displaying contents contained in the mobile service data according to the system time clock.

The demodulator outputs fast information channel (FIC) information representing binding information of a virtual channel in an ensemble and the ensemble of the mobile service data, and the mobile service data frame decoder decodes the mobile service data frame using the FIC information.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings;

FIG. 15 illustrates an exemplary bit stream syntax structure with respect to an FIC segment according to an embodiment of the present invention;

FIG. 16 illustrates an exemplary bit stream syntax structure with respect to a payload of an FIC segment according to the present invention, when an FIC type field value is equal to '0';

FIG. 17 illustrates an exemplary bit stream syntax structure of a service map table according to the present invention;

FIG. 18 illustrates an exemplary bit stream syntax structure of an MH audio descriptor according to the present invention;

FIG. 19 illustrates an exemplary bit stream syntax structure of an MH RTP payload type descriptor according to the present invention;

FIG. 20 illustrates an exemplary bit stream syntax structure of an MH current event descriptor according to the present invention;

FIG. 21 illustrates an exemplary bit stream syntax structure of an MH next event descriptor according to the present invention;

FIG. 22 illustrates an exemplary bit stream syntax structure of an MH system time descriptor according to the present invention;

DETAILED DESCRIPTION OF THE INVENTION

Figure 1:
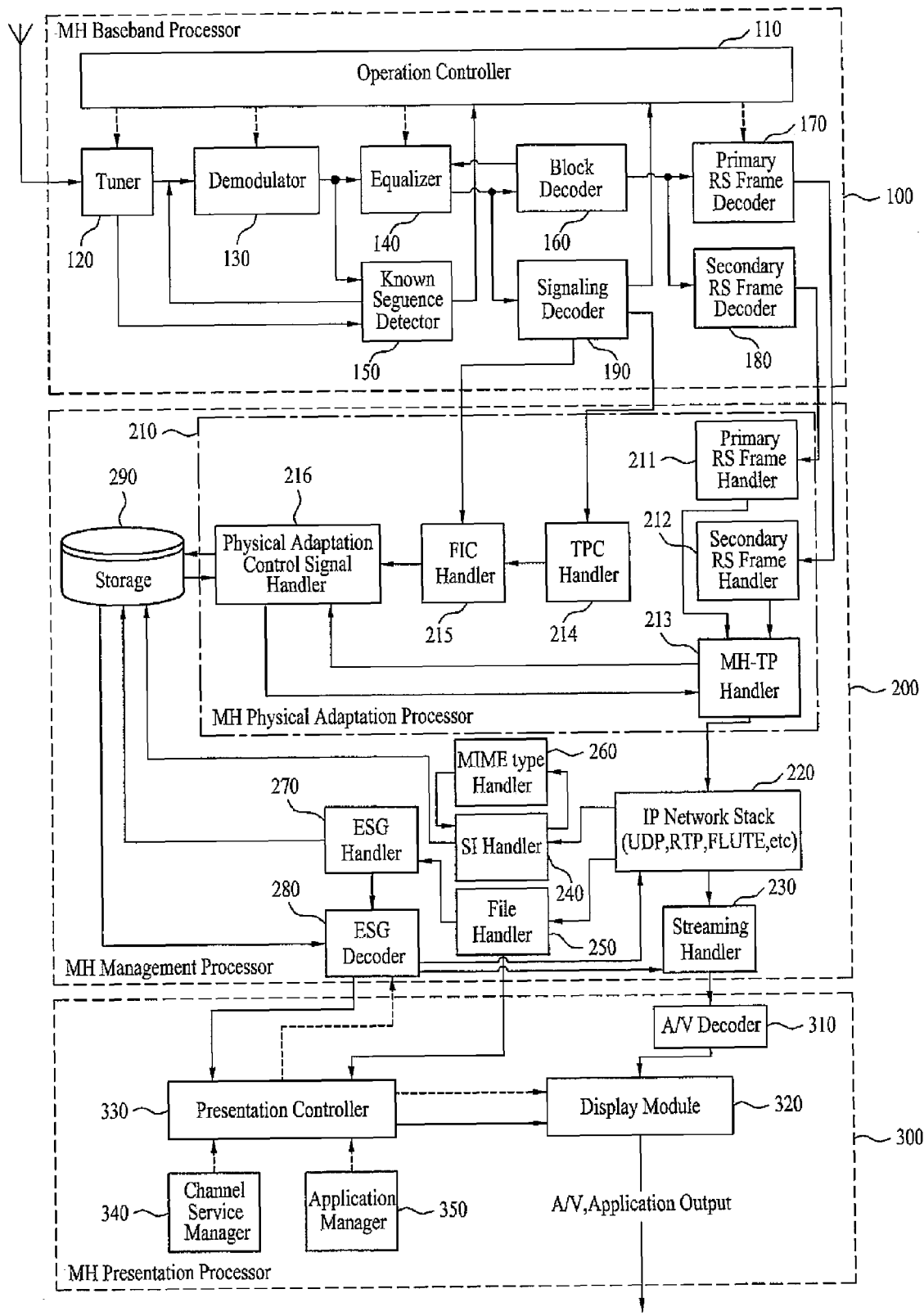
FIG. 1 illustrates a block diagram showing a general structure of a digital broadcasting receiving system according to an embodiment of the present invention.

Reference will now be made in detail to the preferred embodiments of the present invention, which is capable of achieving the object. Herein structures and operations of the invention illustrated in figures and described by being referred to the figures are embodiments, and the technical spirits and core structures of the invention are not limited in the embodiments.

Definition of the Terms Used in the Embodiments

Although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "MH" corresponds to the initials of "mobile" and "handheld" and represents the opposite concept of a fixed-type system. Furthermore, the MH service data may include at least one of mobile service data and handheld service data, and will also be referred to as "mobile service data" for simplicity. Herein, the mobile service data not only correspond to MH service data but may also include any type of service data with mobile or portable characteristics. Therefore, the mobile service data according to the present invention are not limited only to the MH service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

In the present invention, the transmitting system provides backward compatibility in the main service data so as to be received by the conventional receiving system. Herein, the main service data and the mobile service data are multiplexed to the same physical channel and then transmitted.

Furthermore, the digital broadcast transmitting system according to the present invention performs additional encoding on the mobile service data and inserts the data already known by the receiving system and transmitting system (e.g., known data), thereby transmitting the processed data.

Therefore, when using the transmitting system according to the present invention, the receiving system may receive the mobile service data during a mobile state and may also receive the mobile service data with stability despite various distortion and noise occurring within the channel.

Receiving System

FIG. 1 illustrates a block diagram showing a general structure of a digital broadcasting receiving system according to an embodiment of the present invention. The digital broadcast receiving system according to the present invention includes a baseband processor 100, a management processor 200, and a presentation processor 300.

The baseband processor 100 includes an operation controller 110, a tuner 120, a demodulator 130, an equalizer 140, a known sequence detector (or known data detector) 150, a block decoder (or mobile handheld block decoder) 160, a primary Reed-Solomon (RS) frame decoder 170, a secondary RS frame decoder 180, and a signaling decoder 190. The operation controller 110 controls the operation of each block included in the baseband processor 100.

By tuning the receiving system to a specific physical channel frequency, the tuner 120 enables the receiving system to receive main service data, which correspond to broadcast signals for fixed-type broadcast receiving systems, and mobile service data, which correspond to broadcast signals for mobile broadcast receiving systems. At this point, the tuned frequency of the specific physical channel is down-converted to an intermediate frequency (IF) signal, thereby being outputted to the demodulator 130 and the known sequence detector 140. The passband digital IF signal being outputted from the tuner 120 may only include main service data, or only include mobile service data, or include both main service data and mobile service data.

The demodulator 130 performs self-gain control, carrier wave recovery, and timing recovery processes on the passband digital IF signal inputted from the tuner 120, thereby modifying the IF signal to a baseband signal. Then, the demodulator 130 outputs the baseband signal to the equalizer 140 and the known sequence detector 150. The demodulator 130 uses the known data symbol sequence inputted from the known sequence detector 150 during the timing and/or carrier wave recovery, thereby enhancing the demodulating performance.

The equalizer 140 compensates channel-associated distortion included in the signal demodulated by the demodulator 130. Then, the equalizer 140 outputs the distortion-compensated signal to the block decoder 160. By using a known data symbol sequence inputted from the known sequence detector 150, the equalizer 140 may enhance the equalizing performance. Furthermore, the equalizer 140 may receive feedback on the decoding result from the block decoder 160, thereby enhancing the equalizing performance.

The known sequence detector 150 detects known data place (or position) inserted by the transmitting system from the input/output data (i.e., data prior to being demodulated or data being processed with partial demodulation). Then, the known sequence detector 150 outputs the detected known data position information and known data sequence generated from the detected position information to the demodulator 130 and the equalizer 140. Additionally, in order to allow the block decoder 160 to identify the mobile service data that have been processed with additional encoding by the transmitting system and the main service data that have not been processed with any additional encoding, the known sequence detector 150 outputs such corresponding information to the block decoder 160.

If the data channel-equalized by the equalizer 140 and inputted to the block decoder 160 correspond to data processed with both block-encoding and trellis-encoding by the transmitting system (i.e., data within the RS frame, signaling data), the block decoder 160 may perform trellis-decoding and block-decoding as inverse processes of the transmitting system. On the other hand, if the data channel-equalized by the equalizer 140 and inputted to the block decoder 160 correspond to data processed only with trellis-encoding and not block-encoding by the transmitting system (i.e., main service data), the block decoder 160 may perform only trellis-decoding.

The signaling decoder 190 decoded signaling data that have been channel-equalized and inputted from the equalizer 140. It is assumed that the signaling data inputted to the signaling decoder 190 correspond to data processed with both block-encoding and trellis-encoding by the transmitting system. Examples of such signaling data may include transmission parameter channel (TPC) data and fast information channel (FIC) data. Each type of data will be described in more detail in a later process. The FIC data decoded by the signaling decoder 190 are outputted to the FIC handler 215. And, the TPC data decoded by the signaling decoder 190 are outputted to the TPC handler 214.

Meanwhile, according to the present invention, the transmitting system uses RS frames by encoding units. Herein, the RS frame may be divided into a primary RS frame and a secondary RS frame. However, according to the embodiment of the present invention, the primary RS frame and the secondary RS frame will be divided based upon the level of importance of the corresponding data.

The primary RS frame decoder 170 receives the data outputted from the block decoder 160. At this point, according to the embodiment of the present invention, the primary RS frame decoder 170 receives only the mobile service data that have been Reed-Solomon (RS)-encoded and/or cyclic redundancy check (CRC)-encoded from the block decoder 160.

Herein, the primary RS frame decoder 170 receives only the mobile service data and not the main service data. The primary RS frame decoder 170 performs inverse processes of an RS frame encoder (not shown) included in the digital broadcast transmitting system, thereby correcting errors existing within the primary RS frame. More specifically, the primary RS frame decoder 170 forms a primary RS frame by grouping a plurality of data groups and, then, correct errors in primary RS frame units. In other words, the primary RS frame decoder 170 decodes primary RS frames, which are being transmitted for actual broadcast services.

Additionally, the secondary RS frame decoder 180 receives the data outputted from the block decoder 160. At this point, according to the embodiment of the present invention, the secondary RS frame decoder 180 receives only the mobile service data that have been RS-encoded and/or CRC-encoded from the block decoder 160. Herein, the secondary RS frame decoder 180 receives only the mobile service data and not the main service data. The secondary RS frame decoder 180 performs inverse processes of an RS frame encoder (not shown) included in the digital broadcast transmitting system, thereby correcting errors existing within the secondary RS frame. More specifically, the secondary RS frame decoder 180 forms a secondary RS frame by grouping a plurality of data groups and, then, correct errors in secondary RS frame units. In other words, the secondary RS frame decoder 180 decodes secondary RS frames, which are being transmitted for mobile audio service data, mobile video service data, guide data, and so on.

Meanwhile, the management processor 200 according to an embodiment of the present invention includes an MH physical adaptation processor 210, an IP network stack 220, a streaming handler 230, a system information (SI) handler 240, a file handler 250, a multi-purpose internet main extensions (MIME) type handler 260, and an electronic service guide (ESG) handler 270, and an ESG decoder 280, and a storage unit 290.

The MH physical adaptation processor 210 includes a primary RS frame handler 211, a secondary RS frame handler 212, an MH transport packet (TP) handler 213, a TPC handler 214, an FIC handler 215, and a physical adaptation control signal handler 216.

The TPC handler 214 receives and processes baseband information required by modules corresponding to the MH physical adaptation processor 210. The baseband information is inputted in the form of TPC data. Herein, the TPC handler 214 uses this information to process the FIC data, which have been sent from the baseband processor 100.

The TPC data are transmitted from the transmitting system to the receiving system via a predetermined region of a data group. The TPC data may include at least one of an MH ensemble ID, an MH sub-frame number, a total number of MH groups (TNoG), an RS frame continuity counter, a column size of RS frame (N), and an FIC version number.

Herein, the MH ensemble ID indicates an identification number of each MH ensemble carried in the corresponding channel. The MH sub-frame number signifies a number identifying the MH sub-frame number in an MH frame, wherein each MH group associated with the corresponding MH ensemble is transmitted. The TNoG represents the total number of MH groups including all of the MH groups belonging to all MH parades included in an MH sub-frame.

The RS frame continuity counter indicates a number that serves as a continuity counter of the RS frames carrying the corresponding MH ensemble. Herein, the value of the RS frame continuity counter shall be incremented by 1 modulo 16 for each successive RS frame.

N represents the column size of an RS frame belonging to the corresponding MH ensemble. Herein, the value of N determines the size of each MH TP.

Finally, the FIC version number signifies the version number of an FIC body carried on the corresponding physical channel.

As described above, diverse TPC data are inputted to the TPC handler 214 via the signaling decoder 190 shown in FIG. 1. Then, the received TPC data are processed by the TPC handler 214. The received TPC data may also be used by the FIC handler 215 in order to process the FIC data.

The FIC handler 215 processes the FIC data by associating the FIC data received from the baseband processor 100 with the TPC data.

The physical adaptation control signal handler 216 collects FIC data received through the FIC handler 215 and SI data received through RS frames. Then, the physical adaptation control signal handler 216 uses the collected FIC data and SI data to configure and process IP datagrams and access information of mobile broadcast services. Thereafter, the physical adaptation control signal handler 216 stores the processed IP datagrams and access information to the storage unit 290.

The primary RS frame handler 211 identifies primary RS frames received from the primary RS frame decoder 170 of the baseband processor 100 for each row unit, so as to configure an MH TP. Thereafter, the primary RS frame handler 211 outputs the configured MH TP to the MH TP handler 213.

The secondary RS frame handler 212 identifies secondary RS frames received from the secondary RS frame decoder 180 of the baseband processor 100 for each row unit, so as to configure an MH TP. Thereafter, the secondary RS frame handler 212 outputs the configured MH TP to the MH TP handler 213.

The MH transport packet (TP) handler 213 extracts a header from each MH TP received from the primary RS frame handler 211 and the secondary RS frame handler 212, thereby determining the data included in the corresponding MH TP. Then, when the determined data correspond to SI data (i.e., SI data that are not encapsulated to IP datagrams), the corresponding data are outputted to the physical adaptation control signal handler 216. Alternatively, when the determined data correspond to an IP datagram, the corresponding data are outputted to the IP network stack 220.

The IP network stack 220 processes broadcast data that are being transmitted in the form of IP datagrams. More specifically, the IP network stack 220 processes data that are inputted via user datagram protocol (UDP), real-time transport protocol (RTP), real-time transport control protocol (RTCP), asynchronous layered coding/layered coding transport (ALC/LCT), file delivery over unidirectional transport (FLUTE), and so on. Herein, when the processed data correspond to streaming data, the corresponding data are outputted to the streaming handler 230. And, when the processed data correspond to data in a file format, the corresponding data are outputted to the file handler 250. Finally, when the processed data correspond to SI-associated data, the corresponding data are outputted to the SI handler 240.

The SI handler 240 receives and processes SI data having the form of IP datagrams, which are inputted to the IP network stack 220. When the inputted data associated with SI correspond to MIME-type data, the inputted data are outputted to the MIME-type handler 260. The MIME-type handler 260 receives the MIME-type SI data outputted from the SI handler 240 and processes the received MIME-type SI data.

The file handler 250 receives data from the IP network stack 220 in an object format in accordance with the ALC/LCT and FLUTE structures. The file handler 250 groups the received data to create a file format. Herein, when the corresponding file includes ESG, the file is outputted to the ESG handler 270. On the other hand, when the corresponding file includes data for other file-based services, the file is outputted to the presentation controller 330 of the presentation processor 300.

The ESG handler 270 processes the ESG data received from the file handler 250 and stores the processed ESG data to the storage unit 290. Alternatively, the ESG handler 270 may output the processed ESG data to the ESG decoder 280, thereby allowing the ESG data to be used by the ESG decoder 280.

The storage unit 290 stores the system information (SI) received from the physical adaptation control signal handler 210 and the ESG handler 270 therein. Thereafter, the storage unit 290 transmits the stored SI data to each block.

The ESG decoder 280 either recovers the ESG data and SI data stored in the storage unit 290 or recovers the ESG data transmitted from the ESG handler 270. Then, the ESG decoder 280 outputs the recovered data to the presentation controller 330 in a format that can be outputted to the user.

The streaming handler 230 receives data from the IP network stack 220, wherein the format of the received data are in accordance with RTP and/or RTCP structures. The streaming handler 230 extracts audio/video streams from the received data, which are then outputted to the audio/video (A/V) decoder 310 of the presentation processor 300. The audio/video decoder 310 then decodes each of the audio stream and video stream received from the streaming handler 230.

The display module 320 of the presentation processor 300 receives audio and video signals respectively decoded by the A/V decoder 310. Then, the display module 320 provides the received audio and video signals to the user through a speaker and/or a screen.

The presentation controller 330 corresponds to a controller managing modules that output data received by the receiving system to the user.

The channel service manager 340 manages an interface with the user, which enables the user to use channel-based broadcast services, such as channel map management, channel service connection, and so on.

The application manager 350 manages an interface with a user using ESG display or other application services that do not correspond to channel-based services.

Meanwhile, The streaming handler 230 may include a buffer temporarily storing audio/video data. The digital broadcasting reception system periodically sets reference time information to a system time clock, and then the stored audio/video data can be transferred to A/V decoder 310 at a constant bitrate. Accordingly, the audio/video data can be processed at a bitrate and audio/video service can be provided.

Data Format Structure

Meanwhile, the data structure used in the mobile broadcasting technology according to the embodiment of the present invention may include a data group structure and an RS frame structure, which will now be described in detail.

Figure 2:
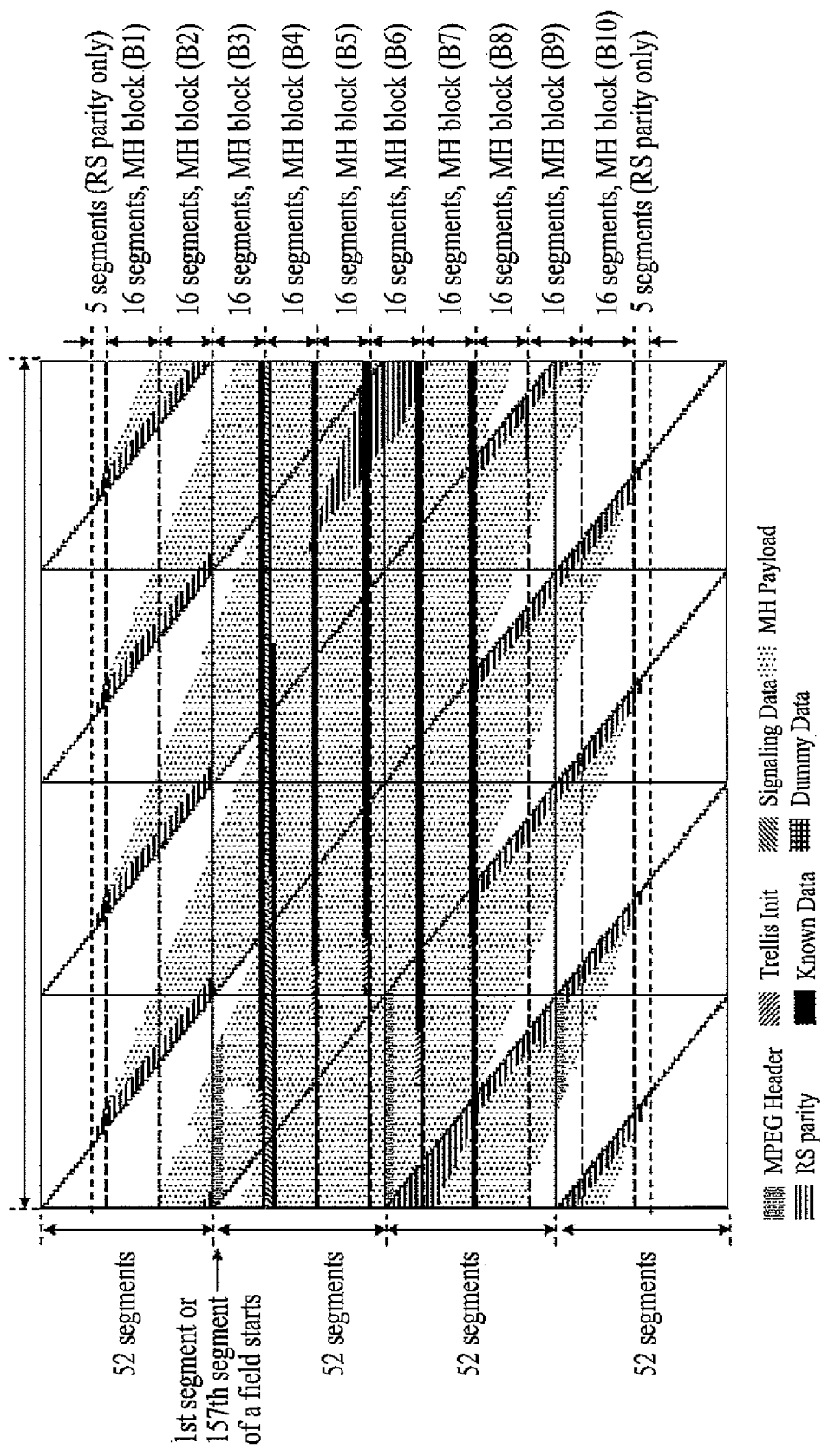
FIG. 2 illustrates an exemplary structure of a data group according to the present invention.

FIG. 2 illustrates an exemplary structure of a data group according to the present invention.

FIG. 2 shows an example of dividing a data group according to the data structure of the present invention into 10 MH blo In this example, each MH block has the length of 16 segments. Referring to FIG. 2, only the RS parity data are allocated to portions of the first 5 segments of the MH block 1 (B1) and the last 5 segments of the MH block 10 (B10). The RS parity data are excluded in regions A to D of the data group.

More specifically, when it is assumed that one data group is divided into regions A, B, C, and D, each MH block may be included in any one of region A to region D depending upon the characteristic of each MH block within the data group.

Herein, the data group is divided into a plurality of regions to be used for different purposes. More specifically, a region of the main service data having no interference or a very low interference level may be considered to have a more resistant (or stronger) receiving performance as compared to regions having higher interference levels. Additionally, when using a system inserting and transmitting known data in the data group, wherein the known data are known based upon an agreement between the transmitting system and the receiving system, and when consecutively long known data are to be periodically inserted in the mobile service data, the known data having a predetermined length may be periodically inserted in the region having no interference from the main service data (i.e., a region wherein the main service data are not mixed). However, due to interference from the main service data, it is difficult to periodically insert known data and also to insert consecutively long known data to a region having interference from the main service data.

Referring to FIG. 2, MH block 4 (B4) to MH block 7 (B7) correspond to regions without interference of the main service data. MH block 4 (B4) to MH block 7 (B7) within the data group shown in FIG. 2 correspond to a region where no interference from the main service data occurs. In this example, a long known data sequence is inserted at both the beginning and end of each MH block. In the description of the present invention, the region including MH block 4 (B4) to MH block 7 (B7) will be referred to as "region A (=B4+B5+B6+B7)". As described above, when the data group includes region A having a long known data sequence inserted at both the beginning and end of each MH block, the receiving system is capable of performing equalization by using the channel information that can be obtained from the known data. Therefore, the strongest equalizing performance may be yielded (or obtained) from one of region A to region D.

In the example of the data group shown in FIG. 2, MH block 3 (B3) and MH block 8 (B8) correspond to a region having little interference from the main service data. Herein, a long known data sequence is inserted in only one side of each MH block B3 and B8. More specifically, due to the interference from the main service data, a long known data sequence is inserted at the end of MH block 3 (B3), and another long known data sequence is inserted at the beginning of MH block 8 (B8). In the present invention, the region including MH block 3 (B3) and MH block 8 (B8) will be referred to as "region B (=B3+B8)". As described above, when the data group includes region B having a long known data sequence inserted at only one side (beginning or end) of each MH block, the receiving system is capable of performing equalization by using the channel information that can be obtained from the known data. Therefore, a stronger equalizing performance as compared to region C/D may be yielded (or obtained).

Referring to FIG. 2, MH block 2 (B2) and MH block 9 (B9) correspond to a region having more interference from the main service data as compared to region B. A long known data sequence cannot be inserted in any side of MH block 2 (B2) and MH block 9 (B9). Herein, the region including MH block 2 (B2) and MH block 9 (B9) will be referred to as "region C (=B2+B9)".

Finally, in the example shown in FIG. 2, MH block 1 (B1) and MH block 10 (B10) correspond to a region having more interference from the main service data as compared to region C. Similarly, a long known data sequence cannot be inserted in any side of MH block 1 (B1) and MH block 10 (B10). Herein, the region including MH block 1 (B1) and MH block 10 (B10) will be referred to as "region D (=B1+B10)". Since region C/D is spaced further apart from the known data sequence, when the channel environment undergoes frequent and abrupt changes, the receiving performance of region C/D may be deteriorated.

Additionally, the data group includes a signaling information area wherein signaling information is assigned (or allocated).

In the present invention, the signaling information area may start from the $1^{st}$ segment of the $4^{th}$ MH block (B4) to a portion of the $2^{nd}$ segment.

According to an embodiment of the present invention, the signaling information area for inserting signaling information may start from the $1^{st}$ segment of the $4^{th}$ MH block (B4) to a portion of the $2^{nd}$ segment. More specifically, 276(=207+69) bytes of the $4^{th}$ MH block (B4) in each data group are assigned as the signaling information area. In other words, the signaling information area consists of 207 bytes of the $1^{st}$ segment and the first 69 bytes of the $2^{nd}$ segment of the $4^{th}$ MH block (B4). The $1^{st}$ segment of the $4^{th}$ MH block (B4) corresponds to the $17^{th}$ or $173^{rd}$ segment of a VSB field.

Herein, the signaling information may be identified by two different types of signaling channels: a transmission parameter channel (TPC) and a fast information channel (FIC).

Herein, the TPC data may include at least one of an MH ensemble ID, an MH sub-frame number, a total number of MH groups (TNoG), an RS frame continuity counter, a column size of RS frame (N), and an FIC version number. However, the TPC data (or information) presented herein are merely exemplary. And, since the adding or deleting of signaling information included in the TPC data may be easily adjusted and modified by one skilled in the art, the present invention will, therefore, not be limited to the examples set forth herein. Furthermore, the FIC is provided to enable a fast service acquisition of data receivers, and the FIC includes cross layer information between the physical layer and the upper layer(s). For example, when the data group includes 6 known data sequences, as shown in FIG. 2, the signaling information area is located between the first known data sequence and the second known data sequence. More specifically, the first known data sequence is inserted in the last 2 segments of the $3^{rd}$ MH block (B3), and the second known data sequence is inserted in the $2^{nd}$ and $3^{rd}$ segments of the $4^{th}$ MH block (B4). Furthermore, the $3^{rd}$ to $6^{th}$ known data sequences are respectively inserted in the last 2 segments of each of the $4^{th}$, $5^{th}$, $6^{th}$, and $7^{th}$ MH blocks (B4, B5, B6, and B7). The $1^{st}$ and $3^{rd}$ to $6^{th}$ known data sequences are spaced apart by 16 segments.

Figure 3:
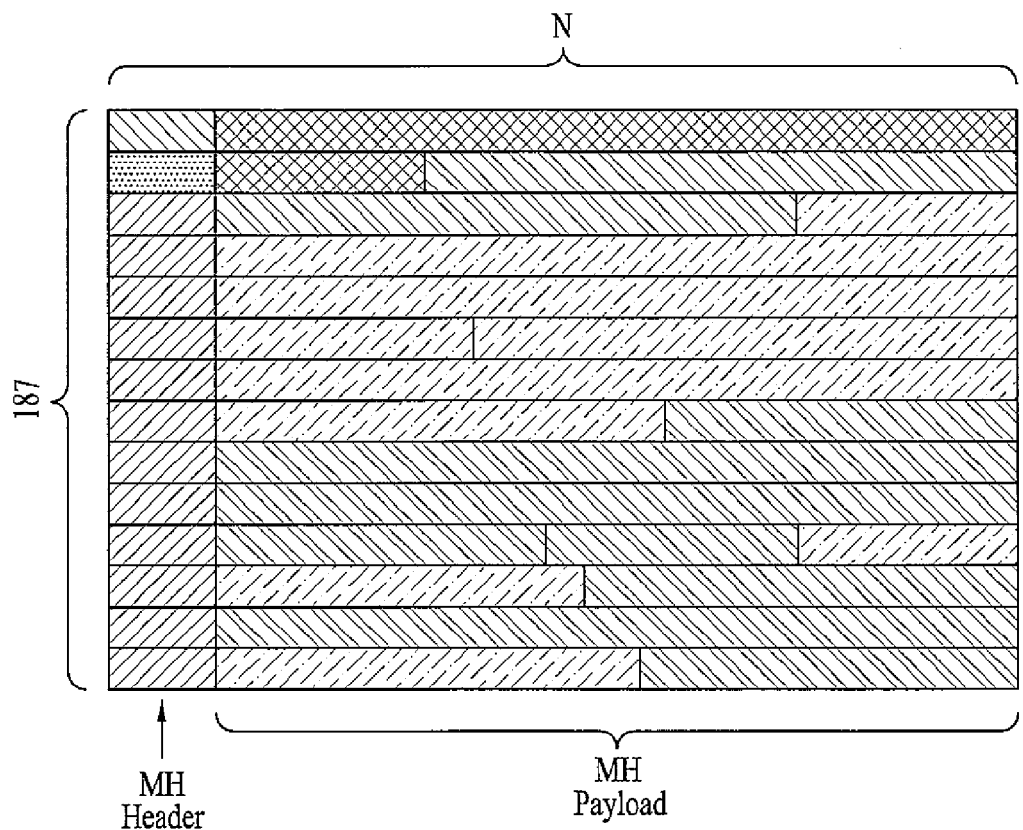
FIG. 3 illustrates an RS frame according to an embodiment of the present invention.

FIG. 3 illustrates an RS frame according to an embodiment of the present invention.

The RS frame shown in FIG. 3 corresponds to a collection of one or more data groups. The RS frame is received for each MH frame in a condition where the receiving system receives the FIC and processes the received FIC and where the receiving system is switched to a time-slicing mode so that the receiving system can receive MH ensembles including ESG entry points. Each RS frame includes IP streams of each service or ESG, and SMT section data may exist in all RS frames.

The RS frame according to the embodiment of the present invention consists of at least one MH transport packet (TP). Herein, the MH TP includes an MH header and an MH payload.

The MH payload may include mobile service data as weak as signaling data. More specifically, an MH payload may include only mobile service data, or may include only signaling data, or may include both mobile service data and signaling data.

According to the embodiment of the present invention, the MH header may identify (or distinguish) the data types included in the MH payload. More specifically, when the MH TP includes a first MH header, this indicates that the MH payload includes only the signaling data. Also, when the MH TP includes a second MH header, this indicates that the MH payload includes both the signaling data and the mobile service data. Finally, when MH TP includes a third MH header, this indicates that the MH payload includes only the mobile service data.

In the example shown in FIG. 3, the RS frame is assigned with IP datagrams (IP datagram 1 and IP datagram 2) for two service types.

The IP datagram in the MH-TP in the RS frame may include reference time information (for example, network time stamp (NTP)), the detailed description for the reference time information will be disclosed by being referred to FIGS. 25 to 29.

Data Transmission Structure

Figure 4:
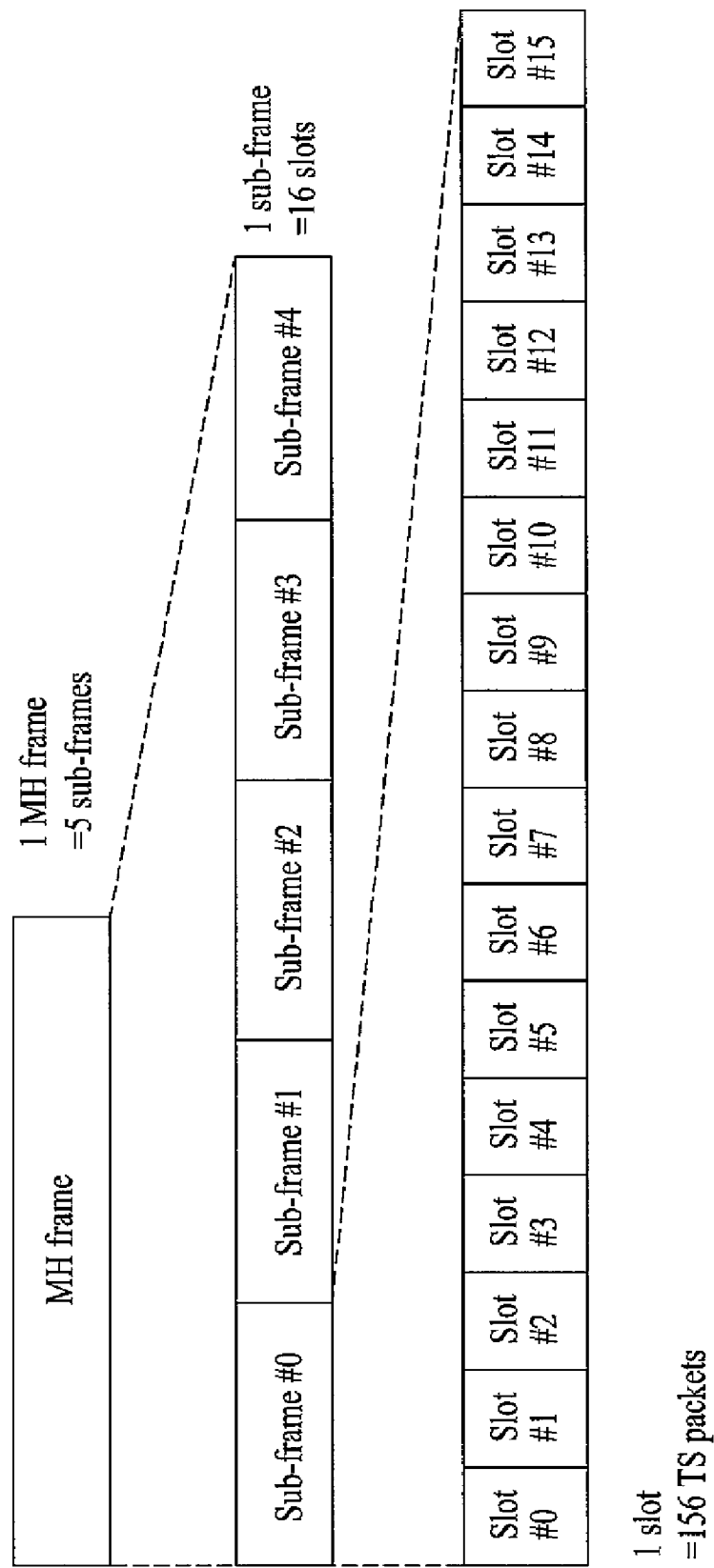
FIG. 4 illustrates an example of an MH frame structure for transmitting and receiving mobile service data according to the present invention.

FIG. 4 illustrates a structure of a MH frame for transmitting and receiving mobile service data according to the present invention.

In the example shown in FIG. 4, one MH frame consists of 5 sub-frames, wherein each sub-frame includes 16 slots. In this case, the MH frame according to the present invention includes 5 sub-frames and 80 slots.

Also, in a packet level, one slot is configured of 156 data packets (i.e., transport stream packets), and in a symbol level, one slot is configured of 156 data segments. Herein, the size of one slot corresponds to one half (½) of a VSB field. More specifically, since one 207-byte data packet has the same amount of data as a data segment, a data packet prior to being interleaved may also be used as a data segment. At this point, two VSB fields are grouped to form a VSB frame.

Figure 5:
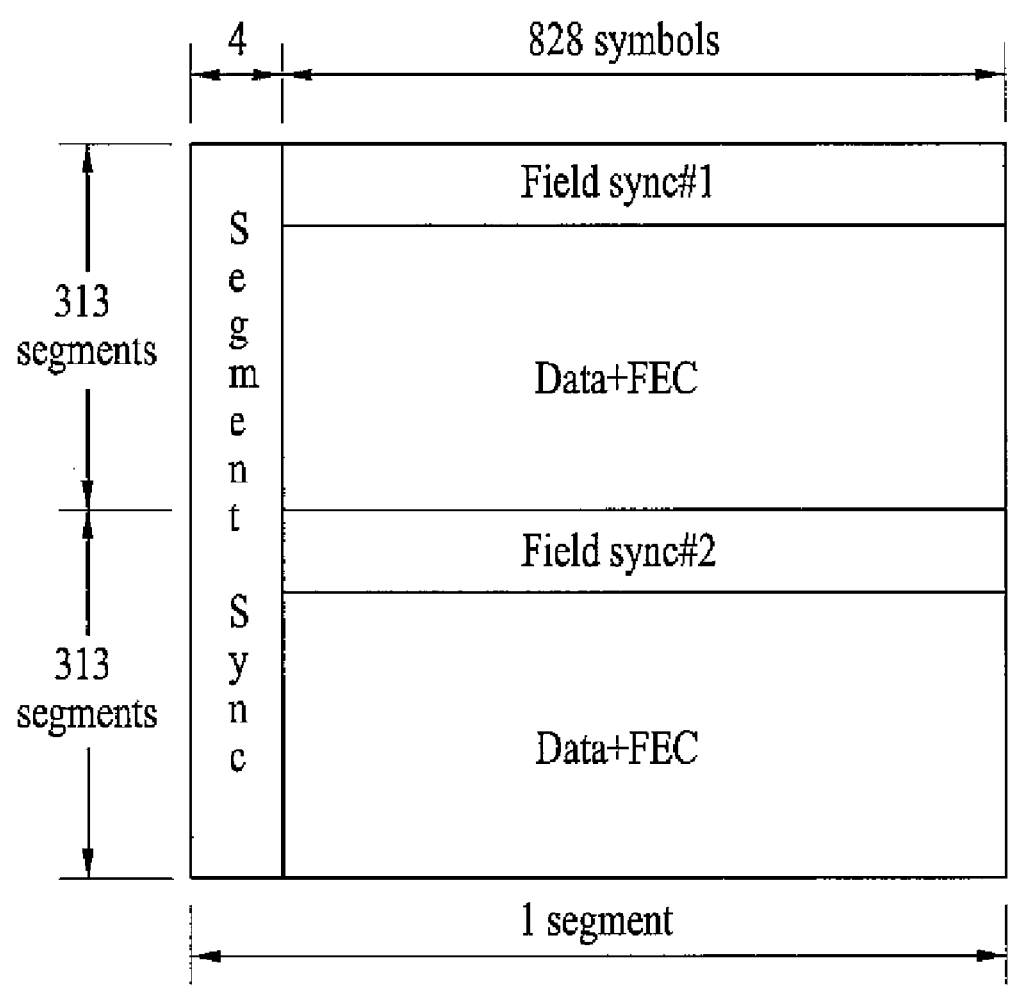
FIG. 5 illustrates an example of a general VSB frame structure.

FIG. 5 illustrates an exemplary structure of a VSB frame, wherein one VSB frame consists of 2 VSB fields (i.e., an odd field and an even field). Herein, each VSB field includes a field synchronization segment and 312 data segments. The slot corresponds to a basic time unit for multiplexing the mobile service data and the main service data. Herein, one slot may either include the mobile service data or be configured only of the main service data.

If the first 118 data packets within the slot correspond to a data group, the remaining 38 data packets become the main service data packets. In another example, when no data group exists in a slot, the corresponding slot is configured of 156 main service data packets.

Meanwhile, when the slots are assigned to a VSB frame, an off-set exists for each assigned position.

Figure 6:
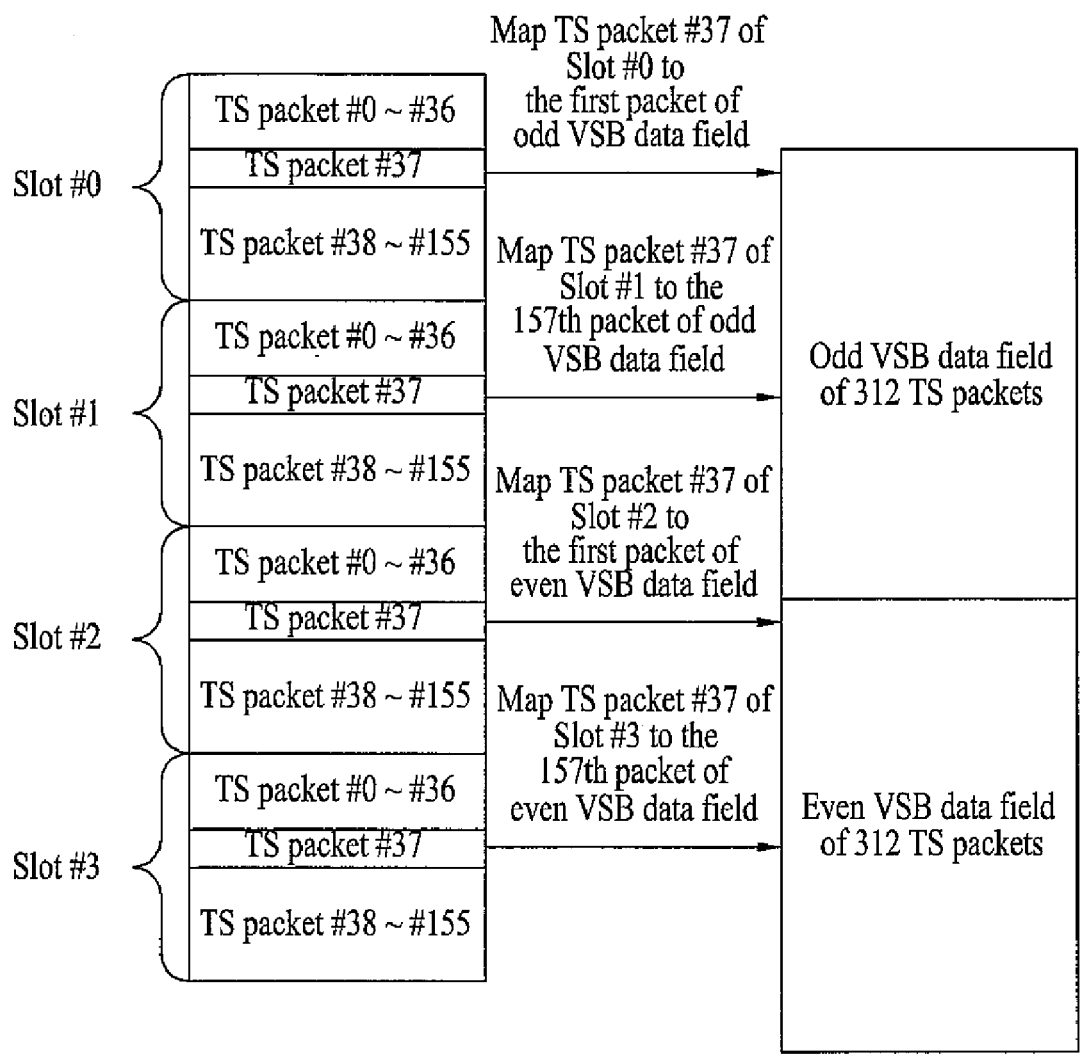
FIG. 6 illustrates a example of mapping positions of the first 4 slots of a sub-frame in a spatial area with respect to a VSB frame.

FIG. 6 illustrates a mapping example of the positions to which the first 4 slots of a sub-frame are assigned with respect to a VSB frame in a spatial area. And, FIG. 7 illustrates a mapping example of the positions to which the first 4 slots of a sub-frame are assigned with respect to a VSB frame in a chronological (or time) area.

Figure 7:
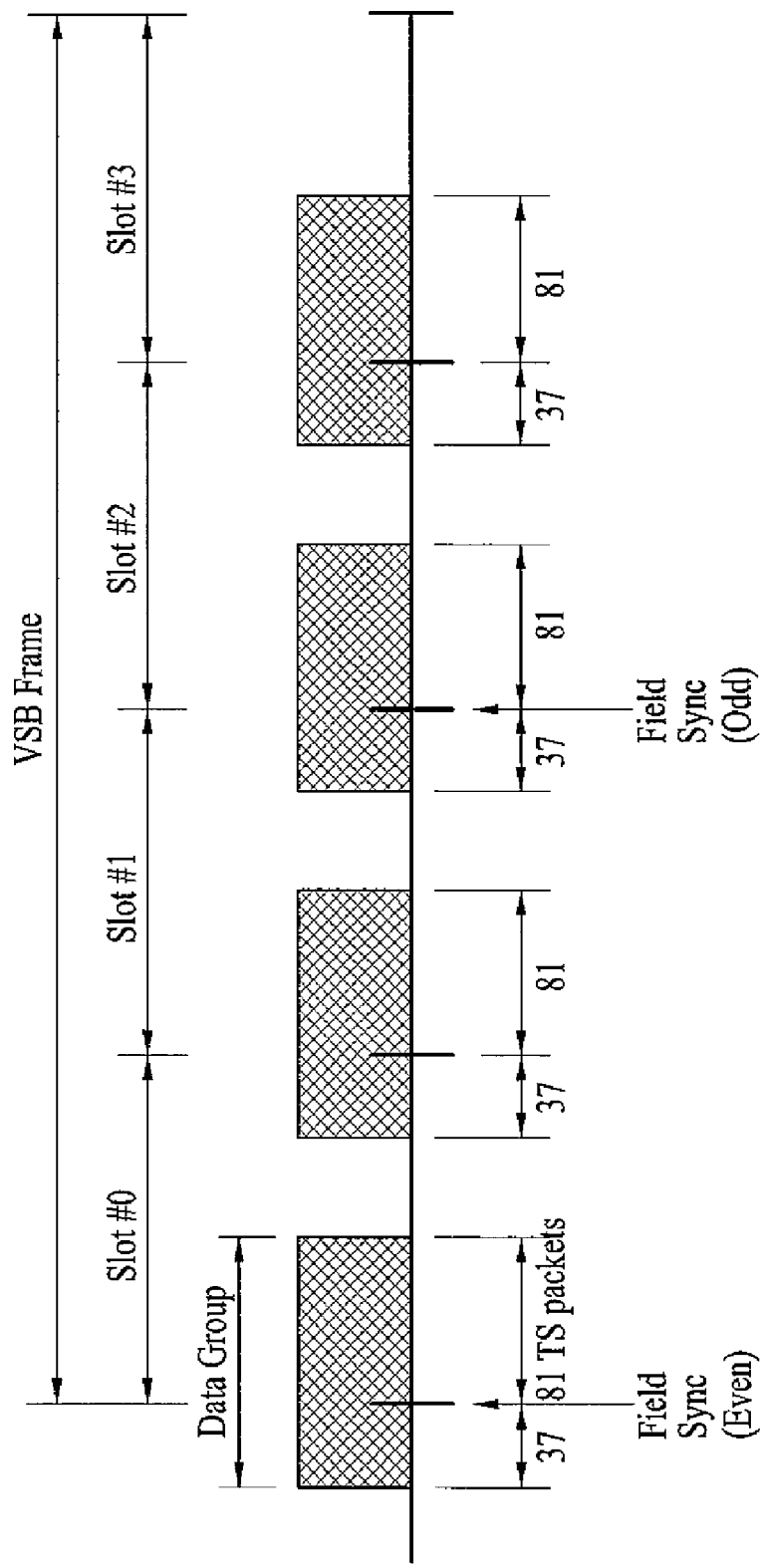
FIG. 7 illustrates a example of mapping positions of the first 4 slots of a sub-frame in a chronological (or time) area with respect to a VSB frame.

Referring to FIG. 6 and FIG. 7, a $38^{th}$ data packet (TS packet #37) of a $1^{st}$ slot (Slot #0) is mapped to the $1^{st}$ data packet of an odd VSB field. A $38^{th}$ data packet (TS packet #37) of a $2^{nd}$ slot (Slot #1) is mapped to the $157^{th}$ data packet of an odd VSB field. Also, a $38^{th}$ data packet (TS packet #37) of a $3^{rd}$ slot (Slot #2) is mapped to the $1^{st}$ data packet of an even VSB field. And, a $38^{th}$ data packet (TS packet #37) of a $4^{th}$ slot (Slot #3) is mapped to the $157^{th}$ data packet of an even VSB field. Similarly, the remaining 12 slots within the corresponding sub-frame are mapped in the subsequent VSB frames using the same method.

Figure 8:
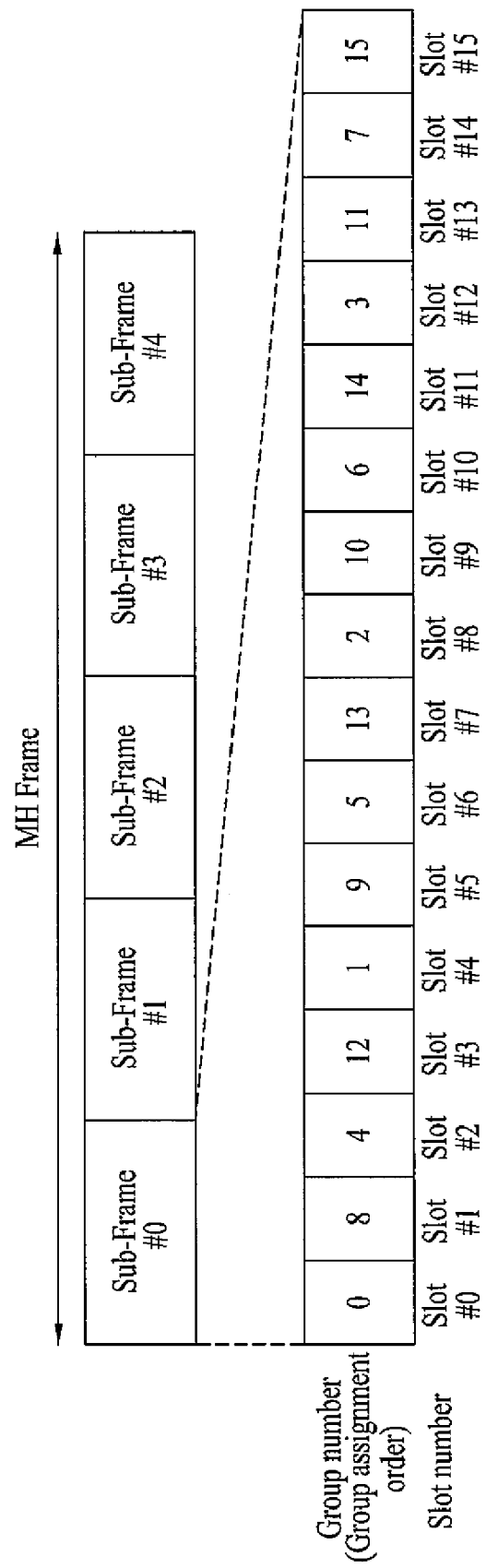
FIG. 8 illustrates an exemplary order of data groups being assigned to one of 5 sub-frames configuring an MH frame according to the present invention.

FIG. 8 illustrates an exemplary assignment order of data groups being assigned to one of 5 sub-frames, wherein the 5 sub-frames configure an MH frame. For example, the method of assigning data groups may be identically applied to all MH frames or differently applied to each MH frame. Furthermore, the method of assigning data groups may be identically applied to all sub-frames or differently applied to each sub-frame. At this point, when it is assumed that the data groups are assigned using the same method in all sub-frames of the corresponding MH frame, the total number of data groups being assigned to an MH frame is equal to a multiple of '5'.

According to the embodiment of the present invention, a plurality of consecutive data groups is assigned to be spaced as far apart from one another as possible within the MH frame. Thus, the system can be capable of responding promptly and effectively to any burst error that may occur within a sub-frame.

For example, when it is assumed that 3 data groups are assigned to a sub-frame, the data groups are assigned to a $1^{st}$ slot (Slot #0), a $5^{th}$ slot (Slot #4), and a $9^{th}$ slot (Slot #8) in the sub-frame, respectively. FIG. 8 illustrates an example of assigning 16 data groups in one sub-frame using the above-described pattern (or rule). In other words, each data group is serially assigned to 16 slots corresponding to the following numbers: 0, 8, 4, 12, 1, 9, 5, 13, 2, 10, 6, 14, 3, 11, 7, and 15. Equation 1 below shows the above-described rule (or pattern) for assigning data groups in a sub-frame.

$$j=(4i+O) \bmod 16 \quad \text{[Equation 1]}$$

O=0 if i<4,
O=2 else if i<8,
Herein, O=1 else if i<12,
O=3 else.

Herein, j indicates the slot number within a sub-frame. The value of j may range from 0 to 15 (i.e., $0 \leq j \leq 5$). Also, variable i indicates the data group number. The value of i may range from 0 to 15 (i.e., $0 \leq i \leq 15$).

In the present invention, a collection of data groups included in a MH frame will be referred to as a "parade". Based upon the RS frame mode, the parade transmits data of at least one specific RS frame.

The mobile service data within one RS frame may be assigned either to all of regions A/B/C/D within the corresponding data group, or to at least one of regions A/B/C/D. In the embodiment of the present invention, the mobile service data within one RS frame may be assigned either to all of regions A/B/C/D, or to at least one of regions A/B and regions C/D. If the mobile service data are assigned to the latter case (i.e., one of regions A/B and regions C/D), the RS frame being assigned to regions A/B and the RS frame being assigned to regions C/D within the corresponding data group are different from one another.

According to the embodiment of the present invention, the RS frame being assigned to regions A/B within the corresponding data group will be referred to as a "primary RS frame", and the RS frame being assigned to regions C/D within the corresponding data group will be referred to as a "secondary RS frame", for simplicity. Also, the primary RS frame and the secondary RS frame form (or configure) one parade. More specifically, when the mobile service data within one RS frame are assigned either to all of regions A/B/C/D within the corresponding data group, one parade transmits one RS frame. Conversely, when the mobile service data within one RS frame are assigned either to at least one of regions A/B and regions C/D, one parade may transmit up to 2 RS frames. More specifically, the RS frame mode indicates whether a parade transmits one RS frame, or whether the parade transmits two RS frames. Such RS frame mode is transmitted as the above-described TPC data. Table 1 below shows an example of the RS frame mode.

TABLE 1

| RS frame mode (2 bits) | Description |
|---|---|
| 00 | There is only one primary RS frame for all group regions |
| 01 | There are two separate RS frames. Primary RS frame for group regions A and B Secondary RS frame for group regions C and D |
| 10 | Reserved |
| 11 | Reserved |

Table 1 illustrates an example of allocating 2 bits in order to indicate the RS frame mode. For example, referring to Table 1, when the RS frame mode value is equal to '00', this indicates that one parade transmits one RS frame. And, when the RS frame mode value is equal to '01', this indicates that one parade transmits two RS frames, i.e., the primary RS frame and the secondary RS frame.

More specifically, when the RS frame mode value is equal to '01', data of the primary RS frame for regions A/B are assigned and transmitted to regions A/B of the corresponding data group. Similarly, data of the secondary RS frame for regions C/D are assigned and transmitted to regions C/D of the corresponding data group.

As described in the assignment of data groups, the parades are also assigned to be spaced as far apart from one another as possible within the sub-frame. Thus, the system can be capable of responding promptly and effectively to any burst error that may occur within a sub-frame. Furthermore, the method of assigning parades may be identically applied to all MH frames or differently applied to each MH frame.

According to the embodiment of the present invention, the parades may be assigned differently for each MH frame and identically for all sub-frames within an MH frame. More specifically, the MH frame structure may vary by MH frame units. Thus, an ensemble rate may be adjusted on a more frequent and flexible basis.

Figure 9:
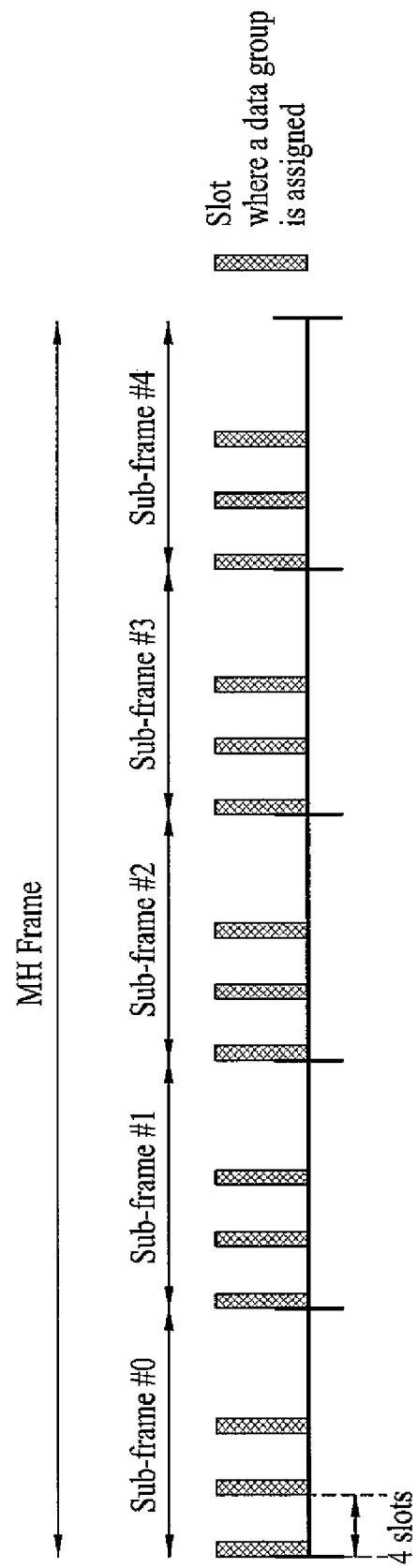
FIG. 9 illustrates an example of a single parade being assigned to an MH frame according to the present invention.

FIG. 9 illustrates an example of multiple data groups of a single parade being assigned (or allocated) to an MH frame. More specifically, FIG. 9 illustrates an example of a plurality of data groups included in a single parade, wherein the number of data groups included in a sub-frame is equal to '3', being allocated to an MH frame.

Referring to FIG. 9, 3 data groups are sequentially assigned to a sub-frame at a cycle period of 4 slots. Accordingly, when this process is equally performed in the 5 sub-frames included in the corresponding MH frame, 15 data groups are assigned to a single MH frame. Herein, the 15 data groups correspond to data groups included in a parade. Therefore, since one sub-frame is configured of 4 VSB frame, and since 3 data groups are included in a sub-frame, the data group of the corresponding parade is not assigned to one of the 4 VSB frames within a sub-frame.

For example, when it is assumed that one parade transmits one RS frame, and that a RS frame encoder (not shown) included in the transmitting system performs RS-encoding on the corresponding RS frame, thereby adding 24 bytes of parity data to the corresponding RS frame and transmitting the processed RS frame, the parity data occupy approximately 11.37% (=24/(187+24)×100) of the total code word length. Meanwhile, when one sub-frame includes 3 data groups, and when the data groups included in the parade are assigned, as shown in FIG. 9, a total of 15 data groups form an RS frame. Accordingly, even when an error occurs in an entire data group due to a burst noise within a channel, the percentile is merely 6.67% (=1/15×100). Therefore, the receiving system may correct all errors by performing an erasure RS decoding process. More specifically, when the erasure RS decoding is performed, a number of channel errors corresponding to the number of RS parity bytes may be corrected. By doing so, the receiving system may correct the error of at least one data group within one parade. Thus, the minimum burst noise length correctable by a RS frame is over 1 VSB frame.

Meanwhile, when data groups of a parade are assigned as shown in FIG. 9, either main service data may be assigned between each data group, or data groups corresponding to different parades may be assigned between each data group. More specifically, data groups corresponding to multiple parades may be assigned to one MH frame.

Basically, the method of assigning data groups corresponding to multiple parades is very similar to the method of assigning data groups corresponding to a single parade. In other words, data groups included in other parades that are to be assigned to an MH frame are also respectively assigned according to a cycle period of 4 slots.

At this point, data groups of a different parade may be sequentially assigned to the respective slots in a circular method. Herein, the data groups are assigned to slots starting from the ones to which data groups of the previous parade have not yet been assigned.

For example, when it is assumed that data groups corresponding to a parade are assigned as shown in FIG. 9, data groups corresponding to the next parade may be assigned to a sub-frame starting either from the $12^{th}$ slot of a sub-frame. However, this is merely exemplary. In another example, the data groups of the next parade may also be sequentially assigned to a different slot within a sub-frame at a cycle period of 4 slots starting from the $3^{rd}$ slot.

Figure 10:
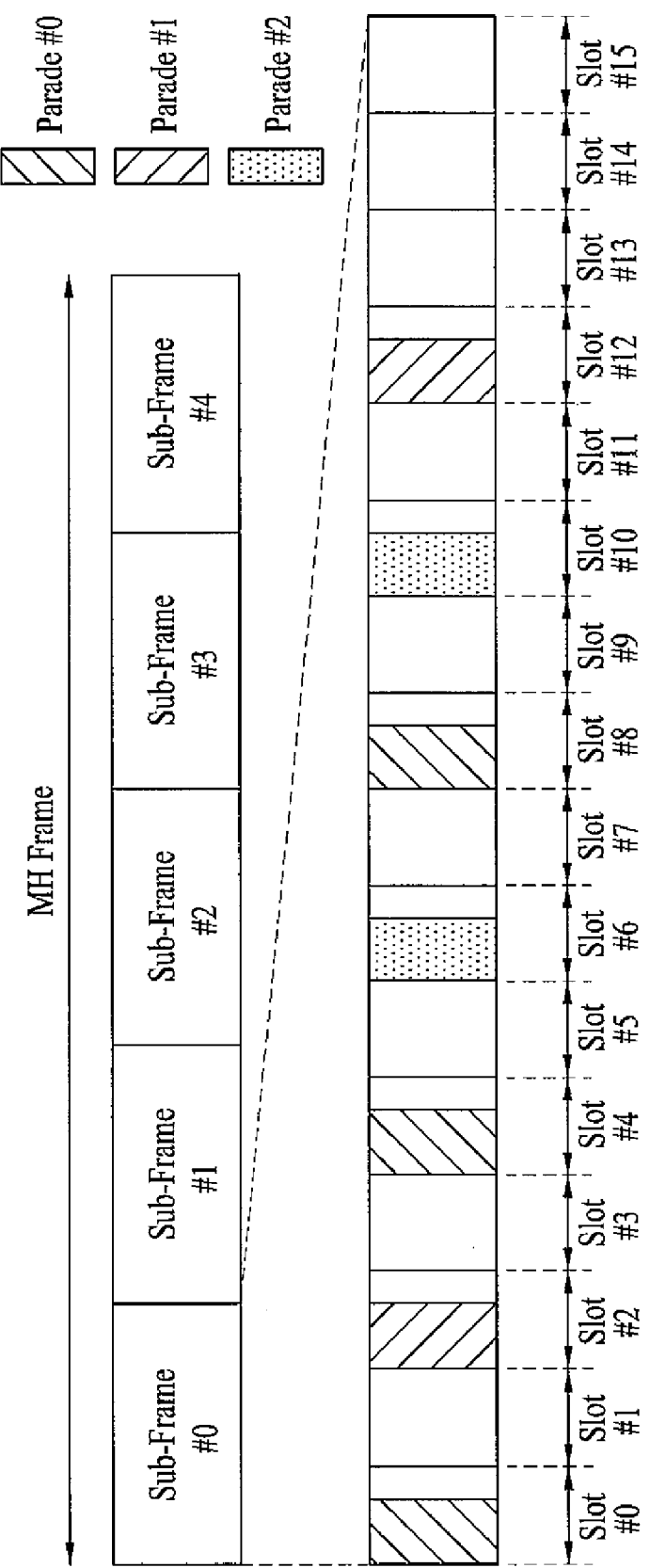
FIG. 10 illustrates an example of 3 parades being assigned to an MH frame according to the present invention.

FIG. 10 illustrates an example of transmitting 3 parades (Parade #0, Parade #1, and Parade #2) to an MH frame. More specifically, FIG. 10 illustrates an example of transmitting parades included in one of 5 sub-frames, wherein the 5 sub-frames configure one MH frame.

When the $1^{st}$ parade (Parade #0) includes 3 data groups for each sub-frame, the positions of each data groups within the sub-frames may be obtained by substituting values '0' to '2' for i in Equation 1. More specifically, the data groups of the $1^{st}$ parade (Parade #0) are sequentially assigned to the $1^{st}$, $5^{th}$, and $9^{th}$ slots (Slot #0, Slot #4, and Slot #8) within the sub-frame.

Also, when the $2^{nd}$ parade includes 2 data groups for each sub-frame, the positions of each data groups within the sub-frames may be obtained by substituting values '3' and '4' for i in Equation 1. More specifically, the data groups of the $2^{nd}$ parade (Parade #1) are sequentially assigned to the $2^{nd}$ and $12^{th}$ slots (Slot #3 and Slot #11) within the sub-frame.

Finally, when the $3^{rd}$ parade includes 2 data groups for each sub-frame, the positions of each data groups within the sub-frames may be obtained by substituting values '5' and '6' for i in Equation 1. More specifically, the data groups of the $3^{rd}$ parade (Parade #2) are sequentially assigned to the $7^{th}$ and $11^{th}$ slots (Slot #6 and Slot #10) within the sub-frame.

As described above, data groups of multiple parades may be assigned to a single MH frame, and, in each sub-frame, the data groups are serially allocated to a group space having 4 slots from left to right.

Therefore, a number of groups of one parade per sub-frame (NoG) may correspond to any one integer from '1' to '8'. Herein, since one MH frame includes 5 sub-frames, the total number of data groups within a parade that can be allocated to an MH frame may correspond to any one multiple of '5' ranging from '5' to '40'.

Figure 11:
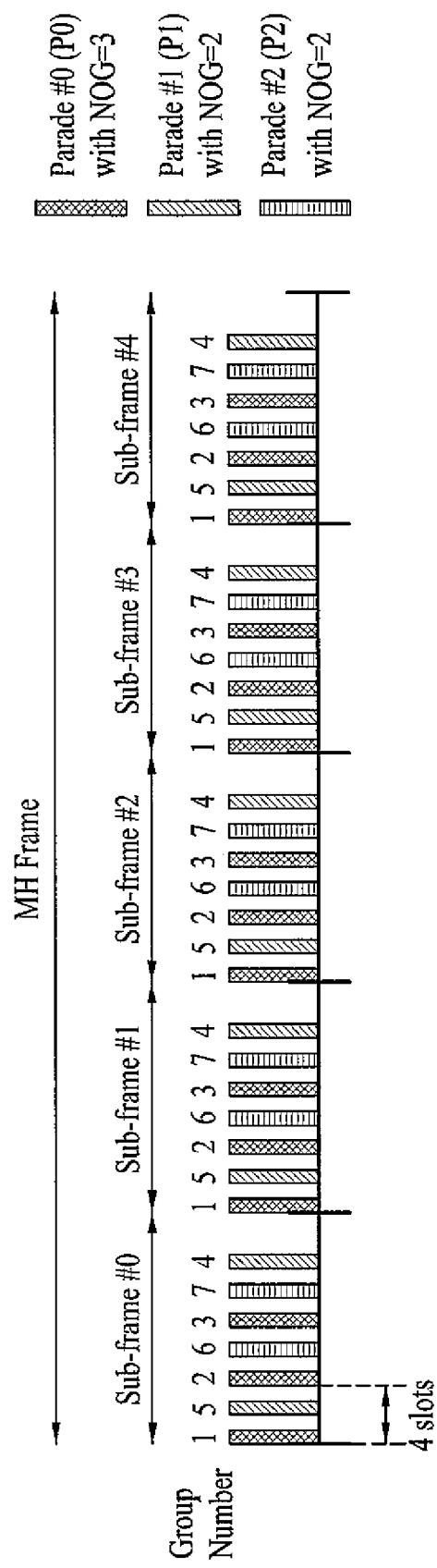
FIG. 11 illustrates an example of the process of assigning 3 parades shown in FIG. 10 being expanded to 5 sub-frames within an MH frame.

FIG. 11 illustrates an example of expanding the assignment process of 3 parades, shown in FIG. 10, to 5 sub-frames within an MH frame.

Figure 12:
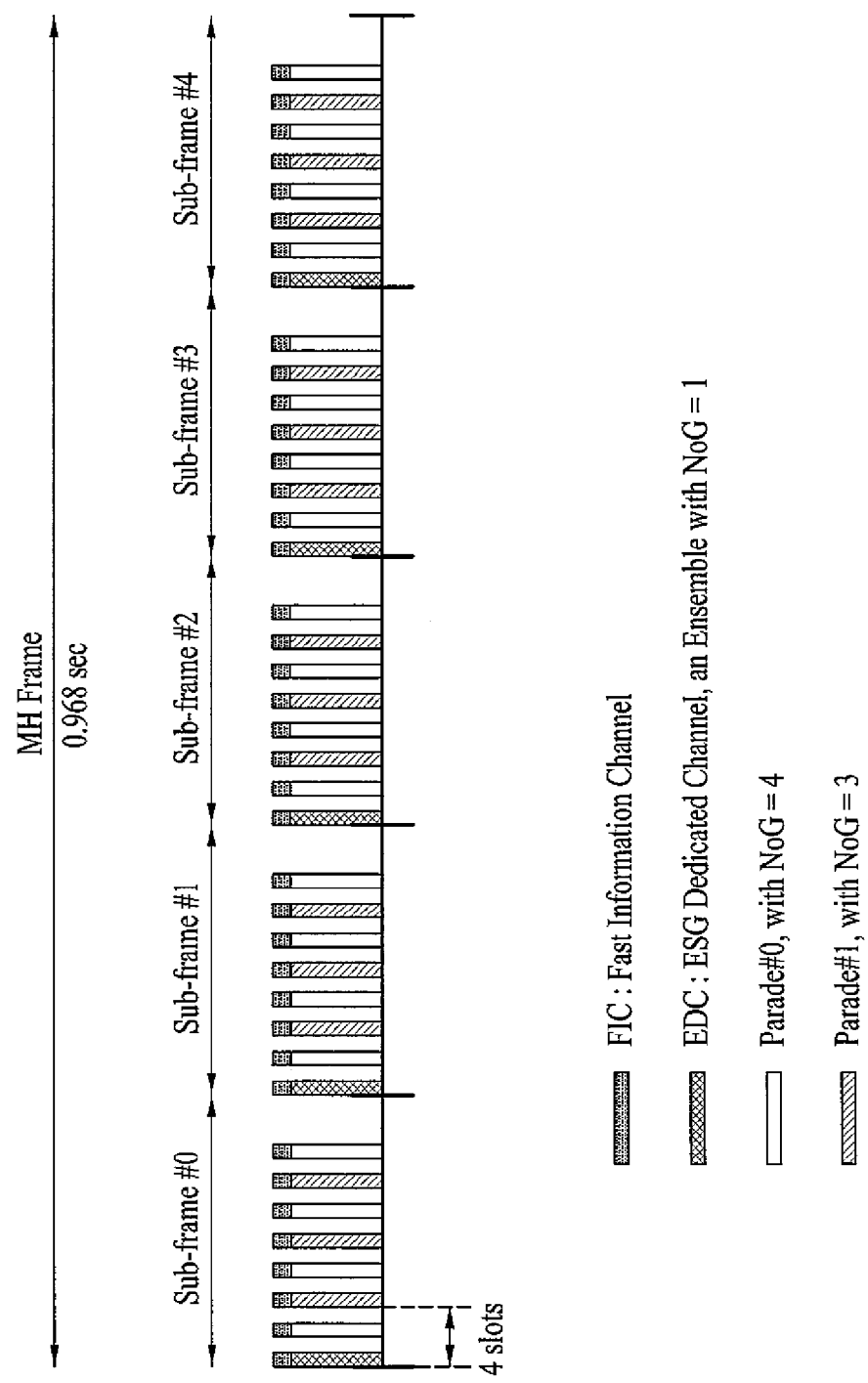
FIG. 12 illustrates a data transmission structure according to an embodiment of the present invention, wherein signaling data are included in a data group so as to be transmitted.

FIG. 12 illustrates a data transmission structure according to an embodiment of the present invention, wherein signaling data are included in a data group so as to be transmitted.

As described above, an MH frame is divided into 5 sub-frames. Data groups corresponding to a plurality of parades co-exist in each sub-frame. Herein, the data groups corresponding to each parade are grouped by MH frame units, thereby configuring a single parade. The data structure shown in FIG. 12 includes 3 parades, one ESG dedicated channel (EDC) parade (i.e., parade with NoG=1), and 2 service parades (i.e., parade with NoG=4 and parade with NoG=3). Also, a predetermined portion of each data group (i.e., 37 bytes/data group) is used for delivering (or sending) FIC information associated with mobile service data, wherein the FIC information is separately encoded from the RS-encoding process. The FIC region assigned to each data group consists of one FIC segments. Herein, each segment is interleaved by MH sub-frame units, thereby configuring an FIC body, which corresponds to a completed FIC transmission structure. However, whenever required, each segment may be interleaved by MH frame units and not by MH sub-frame units, thereby being completed in MH frame units.

Meanwhile, the concept of an MH ensemble is applied in the embodiment of the present invention, thereby defining a collection (or group) of services. Each MH ensemble carries the same QoS and is coded with the same FEC code. Also, each MH ensemble has the same unique identifier (i.e., ensemble ID) and corresponds to consecutive RS frames.

As shown in FIG. 12, the FIC segment corresponding to each data group described service information of an MH ensemble to which the corresponding data group belongs. When FIC segments within a sub-frame are grouped and deinterleved, all service information of a physical channel through which the corresponding FICs are transmitted may be obtained. Therefore, the receiving system may be able to acquire the channel information of the corresponding physical channel, after being processed with physical channel tuning, during a sub-frame period.

Furthermore, FIG. 12 illustrates a structure further including a separate EDC parade apart from the service parade and wherein electronic service guide (ESG) data are transmitted in the $1^{st}$ slot of each sub-frame.

If the digital broadcasting reception system recognizes a frame start point or a frame end point of the MH frame (or the MH subframe), then the digital broadcasting reception system can set the reference time information to the system time clock at the frame start point or the frame end point. The reference time information can be the network time protocol (NTP) timestamp. The detailed description for the reference time information will be disclosed by being referred to FIGS. 25 to 29.

Hierarchical Signaling Structure

Figure 13:
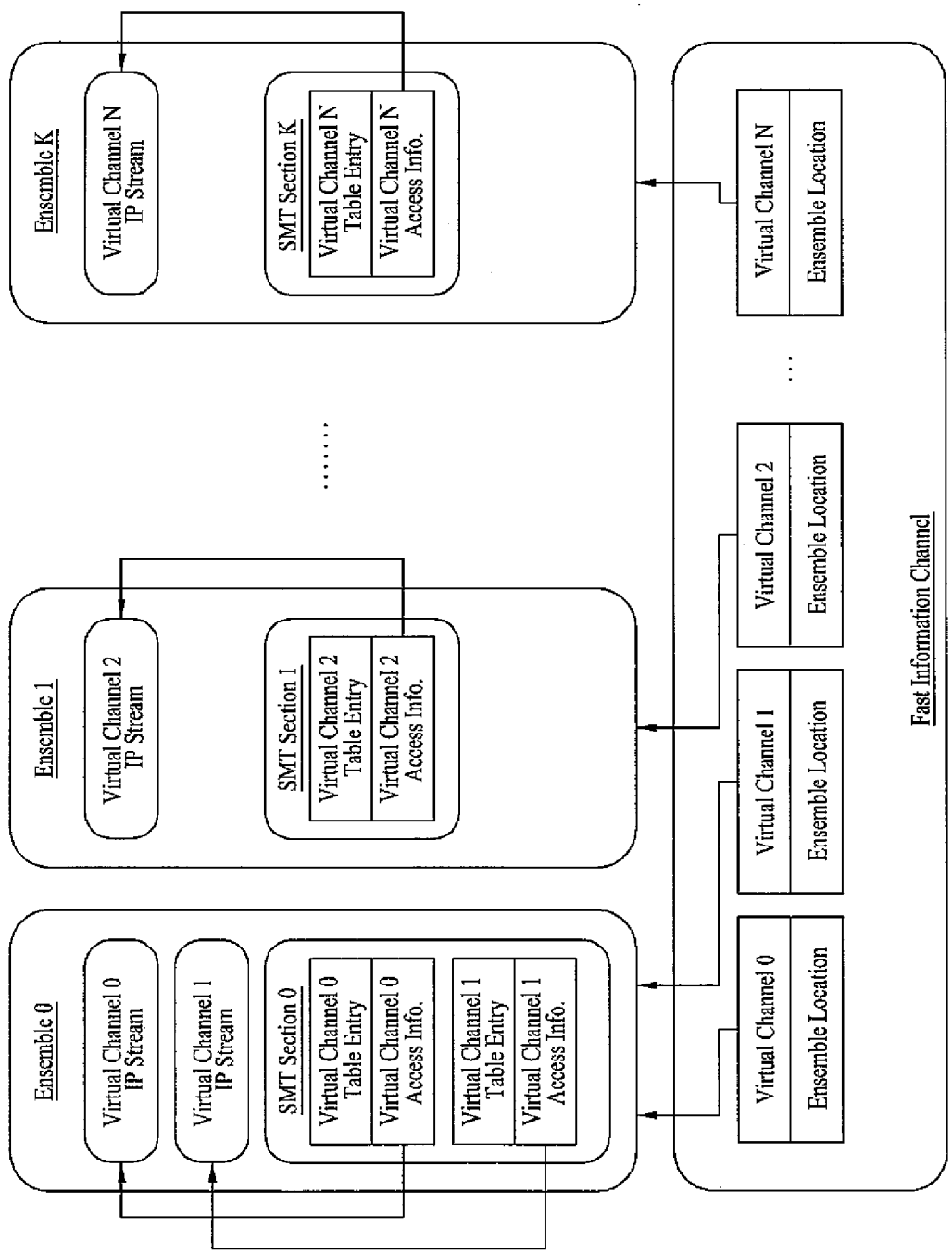
FIG. 13 illustrates a hierarchical signaling structure according to an embodiment of the present invention.

FIG. 13 illustrates a hierarchical signaling structure according to an embodiment of the present invention. As shown in FIG. 13, the mobile broadcasting technology according to the embodiment of the present invention adopts a signaling method using FIC and SMT. In the description of the present invention, the signaling structure will be referred to as a hierarchical signaling structure.

Hereinafter, a detailed description on how the receiving system accesses a virtual channel via FIC and SMT will now be given with reference to FIG. 13.

The FIC body defined in an MH transport (M1) identifies the physical location of each the data stream for each virtual channel and provides very high level descriptions of each virtual channel.

Being MH ensemble level signaling information, the service map table (SMT) provides MH ensemble level signaling information. The SMT provides the IP access information of each virtual channel belonging to the respective MH ensemble within which the SMT is carried. The SMT also provides all IP stream component level information required for the virtual channel service acquisition.

Referring to FIG. 13, each MH ensemble (i.e., Ensemble 0, Ensemble 1, . . . , Ensemble K) includes a stream information on each associated (or corresponding) virtual channel (e.g., virtual channel 0 IP stream, virtual channel 1 IP stream, and virtual channel 2 IP stream). For example, Ensemble 0 includes virtual channel 0 IP stream and virtual channel 1 IP stream. And, each MH ensemble includes diverse information on the associated virtual channel (i.e., Virtual Channel 0 Table Entry, Virtual Channel 0 Access Info, Virtual Channel 1 Table Entry, Virtual Channel 1 Access Info, Virtual Channel 2 Table Entry, Virtual Channel 2 Access Info, Virtual Channel N Table Entry, Virtual Channel N Access Info, and so on).

The FIC body payload includes information on MH ensembles (e.g., ensemble_id field, and referred to as "ensemble location" in FIG. 13) and information on a virtual channel associated with the corresponding MH ensemble (e.g., when such information corresponds to a major_channel_num field and a minor_channel_num field, the information is expressed as Virtual Channel 0, Virtual Channel 1, . . . , Virtual Channel N in FIG. 13).

The application of the signaling structure in the receiving system will now be described in detail.

When a user selects a channel he or she wishes to view (hereinafter, the user-selected channel will be referred to as "channel θ" for simplicity), the receiving system first parses the received FIC. Then, the receiving system acquires information on an MH ensemble (i.e., ensemble location), which is associated with the virtual channel corresponding to channel θ (hereinafter, the corresponding MH ensemble will be referred to as "MH ensemble θ" for simplicity). By acquiring slots only corresponding to the MH ensemble θ using the time-slicing method, the receiving system configures ensemble θ. The ensemble θ configured as described above, includes an SMT on the associated virtual channels (including channel θ) and IP streams on the corresponding virtual channels. Therefore, the receiving system uses the SMT included in the MH ensemble θ in order to acquire various information on channel θ (e.g., Virtual Channel θ Table Entry) and stream access information on channel θ (e.g., Virtual Channel θ Access Info). The receiving system uses the stream access information on channel θ to receive only the associated IP streams, thereby providing channel θ services to the user.

Fast Information Channel (FIC)

The digital broadcast receiving system according to the present invention adopts the fast information channel (FIC) for a faster access to a service that is currently being broadcasted.

More specifically, the FIC handler 215 of FIG. 1 parses the FIC body, which corresponds to an FIC transmission structure, and outputs the parsed result to the physical adaptation control signal handler 216.

Figure 14:
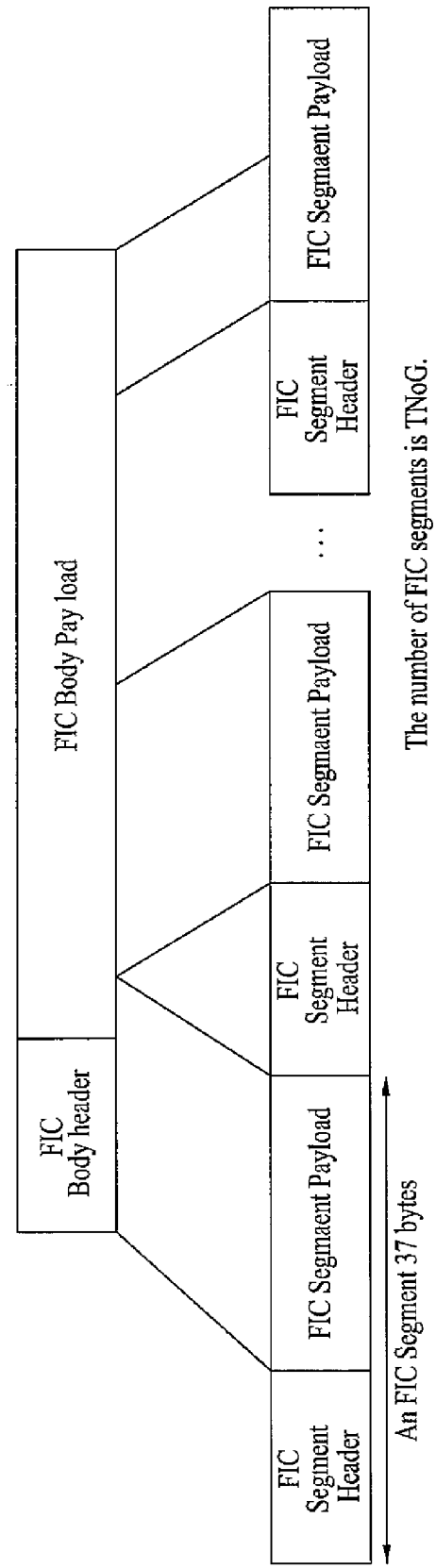
FIG. 14 illustrates an exemplary FIC body format according to an embodiment of the present invention.

FIG. 14 illustrates an exemplary FIC body format according to an embodiment of the present invention. According to the embodiment of the present invention, the FIC format consists of an FIC body header and an FIC body payload.

Meanwhile, according to the embodiment of the present invention, data are transmitted through the FIC body header and the FIC body payload in FIC segment units. Each FIC segment has the size of 37 bytes, and each FIC segment consists of a 2-byte FIC segment header and a 35-byte FIC segment payload. More specifically, an FIC body configured of an FIC body header and an FIC body payload, is segmented in units of 35 data bytes, which are then carried in at least one FIC segment within the FIC segment payload, so as to be transmitted.

In the description of the present invention, an example of inserting one FIC segment in one data group, which is then transmitted, will be given. In this case, the receiving system receives a slot corresponding to each data group by using a time-slicing method.

The signaling decoder 190 included in the receiving system shown in FIG. 1 collects each FIC segment inserted in each data group. Then, the signaling decoder 190 uses the collected FIC segments to created a single FIC body. Thereafter, the signaling decoder 190 performs a decoding process on the FIC body payload of the created FIC body, so that the decoded FIC body payload corresponds to an encoded result of a signaling encoder (not shown) included in the transmitting system. Subsequently, the decoded FIC body payload is outputted to the FIC handler 215. The FIC handler 215 parses the FIC data included in the FIC body payload, and then outputs the parsed FIC data to the physical adaptation control signal handler 216. The physical adaptation control signal handler 216 uses the inputted FIC data to perform processes associated with MH ensembles, virtual channels, SMTs, and so on.

According to an embodiment of the present invention, when an FIC body is segmented, and when the size of the last segmented portion is smaller than 35 data bytes, it is assumed that the lacking number of data bytes in the FIC segment payload is completed with by adding the same number of stuffing bytes therein, so that the size of the last FIC segment can be equal to 35 data bytes.

However, it is apparent that the above-described data byte values (i.e., 37 bytes for the FIC segment, 2 bytes for the FIC segment header, and 35 bytes for the FIC segment payload) are merely exemplary, and will, therefore, not limit the scope of the present invention.

FIG. 15 illustrates an exemplary bit stream syntax structure with respect to an FIC segment according to an embodiment of the present invention.

Herein, the FIC segment signifies a unit used for transmitting the FIC data. The FIC segment consists of an FIC segment header and an FIC segment payload. Referring to FIG. 15, the FIC segment payload corresponds to the portion starting from the 'for' loop statement. Meanwhile, the FIC segment header may include a FIC_type field, an error_indicator field, an FIC_seg_number field, and an FIC_last_seg_number field. A detailed description of each field will now be given.

The FIC_type field is a 2-bit field indicating the type of the corresponding FIC.

The error_indicator field is a 1-bit field, which indicates whether or not an error has occurred within the FIC segment during data transmission. If an error has occurred, the value of the error_indicator field is set to '1'. More specifically, when an error that has failed to be recovered still remains during the configuration process of the FIC segment, the error_indicator field value is set to '1'. The error_indicator field enables the receiving system to recognize the presence of an error within the FIC data.

The FIC_seg_number field is a 4-bit field. Herein, when a single FIC body is divided into a plurality of FIC segments and transmitted, the FIC_seg_number field indicates the number of the corresponding FIC segment.

Finally, the FIC_last_seg_number field is also a 4-bit field. The FIC_last_seg_number field indicates the number of the last FIC segment within the corresponding FIC body.

FIG. 16 illustrates an exemplary bit stream syntax structure with respect to a payload of an FIC segment according to the present invention, when an FIC type field value is equal to '0'.

According to the embodiment of the present invention, the payload of the FIC segment is divided into 3 different regions. A first region of the FIC segment payload exists only when the FIC_seg_number field value is equal to '0'. Herein, the first region may include a current_next_indicator field, an ESG_version field, and a transport_stream_id field. However, depending upon the embodiment of the present invention, it may be assumed that each of the 3 fields exists regardless of the FIC_seg_number field.

The current_next_indicator field is a 1-bit field. The current_next_indicator field acts as an indicator identifying whether the corresponding FIC data carry MH ensemble configuration information of an MH frame including the current FIC segment, or whether the corresponding FIC data carry MH ensemble configuration information of a next MH frame.

The ESG_version field is a 5-bit field indicating ESG version information. Herein, by providing version information on the service guide providing channel of the corresponding ESG, the ESG_version field enables the receiving system to notify whether or not the corresponding ESG has been updated.

Finally, the transport_stream_id field is a 16-bit field acting as a unique identifier of a broadcast stream through which the corresponding FIC segment is being transmitted.

A second region of the FIC segment payload corresponds to an ensemble loop region, which includes an ensemble_id field, an SI_version field, and a num_channel field.

More specifically, the ensemble_id field is an 8-bit field indicating identifiers of an MH ensemble through which MH services are transmitted. The MH services will be described in more detail in a later process. Herein, the ensemble_id field binds the MH services and the MH ensemble.

The SI_version field is a 4-bit field indicating version information of SI data included in the corresponding ensemble, which is being transmitted within the RS frame.

Finally, the num_channel field is an 8-bit field indicating the number of virtual channel being transmitted via the corresponding ensemble.

A third region of the FIC segment payload a channel loop region, which includes a channel_type field, a channel_activity field, a CA_indicator field, a stand_alone_service_indicator field, a major_channel_num field, and a minor_channel_num field.

The channel_type field is a 5-bit field indicating a service type of the corresponding virtual channel. For example, the channel_type field may indicates an audio/video channel, an audio/video and data channel, an audio-only channel, a data-only channel, a file download channel, an ESG delivery channel, a notification channel, and so on.

The channel_activity field is a 2-bit field indicating activity information of the corresponding virtual channel. More specifically, the channel_activity field may indicate whether the current virtual channel is providing the current service.

The CA_indicator field is a 1-bit field indicating whether or not a conditional access (CA) is applied to the current virtual channel.

The stand_alone_service_indicator field is also a 1-bit field, which indicates whether the service of the corresponding virtual channel corresponds to a stand alone service.

The major_channel_num field is an 8-bit field indicating a major_channel number of the corresponding virtual channel.

Finally, the minor_channel_num field is also an 8-bit field indicating a minor channel number of the corresponding virtual channel.

Service Table Map

FIG. 17 illustrates an exemplary bit stream syntax structure of a service map table (hereinafter referred to as "SMT") according to the present invention.

According to the embodiment of the present invention, the SMT is configured in an MPEG-2 private section format. However, this will not limit the scope and spirit of the present invention. The SMT according to the embodiment of the present invention includes description information for each virtual channel within a single MH ensemble. And, additional information may further be included in each descriptor area.

Herein, the SMT according to the embodiment of the present invention includes at least one field and is transmitted from the transmitting system to the receiving system.

As described in FIG. 3, the SMT section may be transmitted by being included in the MH TP within the RS frame. In this case, each of the RS frame decoders 170 and 180, shown in FIG. 1, decodes the inputted RS frame, respectively. Then, each of the decoded RS frames is outputted to the respective RS frame handler 211 and 212. Thereafter, each RS frame handler 211 and 212 identifies the inputted RS frame by row units, so as to create an MH TP, thereby outputting the created MH TP to the MH TP handler 213. When it is determined that the corresponding MH TP includes an SMT section based upon the header in each of the inputted MH TP, the MH TP handler 213 parses the corresponding SMT section, so as to output the SI data within the parsed SMT section to the physical adaptation control signal handler 216. However, this is limited to when the SMT is not encapsulated to IP datagrams.

Meanwhile, when the SMT is not encapsulated to IP datagrams, and when it is determined that the corresponding MH TP includes an SMT section based upon the header in each of the inputted MH TP, the MH TP handler 213 outputs the SMT section to the IP network stack 220. Accordingly, the IP network stack 220 performs IP and UDP processes on the inputted SMT section and, then, outputs the processed SMT section to the SI handler 240. The SI handler 240 parses the inputted SMT section and controls the system so that the parsed SI data can be stored in the storage unit 290.

The following corresponds to example of the fields that may be transmitted through the SMT.

The table_id field corresponds to an 8-bit unsigned integer number, which indicates the type of table section. The table_id field allows the corresponding table to be defined as the service map table (SMT).

The ensemble_id field is an 8-bit unsigned integer field, which corresponds to an ID value associated to the corresponding MH ensemble. Herein, the ensemble_id field may be assigned with a value ranging from range '0x00' to '0x3F'. It is preferable that the value of the ensemble_id field is derived from the parade_id of the TPC data, which is carried from the baseband processor of MH physical layer subsystem. When the corresponding MH ensemble is transmitted through (or carried over) the primary RS frame, a value of '0' may be used for the most significant bit (MSB), and the remaining 7 bits are used as the parade_id value of the associated MH parade (i.e., for the least significant 7 bits). Alternatively, when the corresponding MH ensemble is transmitted through (or carried over) the secondary RS frame, a value of '1' may be used for the most significant bit (MSB).

The num_channels field is an 8-bit field, which specifies the number of virtual channels in the corresponding SMT section.

Meanwhile, the SMT according to the embodiment of the present invention provides information on a plurality of virtual channels using the 'for' loop statement.

The major_channel_num field corresponds to an 8-bit field, which represents the major channel number associated with the corresponding virtual channel. Herein, the major_channel_num field may be assigned with a value ranging from '0x00' to '0xFF'.

The minor_channel_num field corresponds to an 8-bit field, which represents the minor channel number associated with the corresponding virtual channel. Herein, the minor_channel_num field may be assigned with a value ranging from '0x00' to '0xFF'.

The short_channel_name field indicates the short name of the virtual channel.

The service_id field is a 16-bit unsigned integer number (or value), which identifies the virtual channel service.

The service_type field is a 6-bit enumerated type field, which designates the type of service carried in the corresponding virtual channel as defined in Table 2 below.

TABLE 2

| | |
|---|---|
| 0x00 | [Reserved] |
| 0x01 | MH_digital_television field: the virtual channel carries television programming (audio, video and optional associated data) conforming to ATSC standards. |
| 0x02 | MH_audio field: the virtual channel carries audio programming (audio service and optional associated data) conforming to ATSC standards. |
| 0x03 | MH_data_only_service field: the virtual channel carries a data service conforming to ATSC standards, but no video or audio component. |
| 0x04 to 0xFF | [Reserved for future ATSC usage] |

The virtual_channel_activity field is a 2-bit enumerated field identifying the activity status of the corresponding virtual channel. When the most significant bit (MSB) of the virtual_channel_activity field is '1', the virtual channel is active, and when the most significant bit (MSB) of the virtual_channel_activity field is '0', the virtual channel is inactive. Also, when the least significant bit (LSB) of the virtual_channel_activity field is '1', the virtual channel is hidden (when set to 1), and when the least significant bit (LSB) of the virtual_channel_activity field is '0', the virtual channel is not hidden.

The num_components field is a 5-bit field, which specifies the number of IP stream components in the corresponding virtual channel.

The IP_version_flag field corresponds to a 1-bit indicator. More specifically, when the value of the IP_version_flag field is set to '1', this indicates that a source_IP_address field, a virtual_channel_target_IP_address field, and a component_target_IP_address field are IPv6 addresses. Alternatively, when the value of the IP_version_flag field is set to '0', this indicates that the source_IP_address field, the virtual_channel_target_IP_address field, and the component_target_IP_address field are IPv4.

The source_IP_address_flag field is a 1-bit Boolean flag, which indicates, when set, that a source IP address of the corresponding virtual channel exist for a specific multicast source.

The virtual_channel_target_IP_address_flag field is a 1-bit Boolean flag, which indicates, when set, that the corresponding IP stream component is delivered through IP datagrams with target IP addresses different from the virtual_channel_target_IP_address. Therefore, when the flag is set, the receiving system (or receiver) uses the component_target_IP_address as the target_IP_address in order to access the corresponding IP stream component. Accordingly, the receiving system (or receiver) may ignore the virtual_channel_target_IP_address field included in the num_channels loop.

The source_IP_address field corresponds to a 32-bit or 128-bit field. Herein, the source_IP_address field will be significant (or present), when the value of the source_IP_address_flag field is set to '1'. However, when the value of the source_IP_address_flag field is set to '0', the source_IP_address field will become insignificant (or absent). More specifically, when the source_IP_address_flag field value is set to '1', and when the IP_version_flag field value is set to '0', the source_IP_address field indicates a 32-bit IPv4 address, which shows the source of the corresponding virtual channel. Alternatively, when the IP_version_flag field value is set to '1', the source_IP_address field indicates a 128-bit IPv6 address, which shows the source of the corresponding virtual channel.

The virtual_channel_target_IP_address field also corresponds to a 32-bit or 128-bit field. Herein, the virtual_channel_target_IP_address field will be significant (or present), when the value of the virtual_channel_target_IP_address_flag field is set to '1'. However, when the value of the virtual_channel_target_IP_address_flag field is set to '0', the virtual_channel_target_IP_address field will become insignificant (or absent). More specifically, when the virtual_channel_target_IP_address_flag field value is set to '1', and when the IP_version_flag field value is set to '0', the virtual_channel_target_IP_address field indicates a 32-bit target IPv4 address associated to the corresponding virtual channel. Alternatively, when the virtual_channel_target_IP_address_flag field value is set to '1', and when the IP_version_flag field value is set to '1', the virtual_channel_target_IP_address field indicates a 64-bit target IPv6 address associated to the corresponding virtual channel. If the virtual_channel_target_IP_address field is insignificant (or absent), the component_target_IP_address field within the num_channels loop should become significant (or present). And, in order to enable the receiving system to access the IP stream component, the component_target_IP_address field should be used.

Meanwhile, the SMT according to the embodiment of the present invention uses a 'for' loop statement in order to provide information on a plurality of components.

Herein, the RTP_payload_type field, which is assigned with 7 bits, identifies the encoding format of the component based upon Table 3 shown below. When the IP stream component is not encapsulated to RTP, the RTP_payload_type field shall be ignored (or deprecated).

Table 3 below shows an example of an RTP payload type.

TABLE 3

| RTP_payload_type | Meaning |
| --- | --- |
| 35 | AVC video |
| 36 | MH audio |
| 37 to 72 | [Reserved for future ATSC use] |

The component_target_IP_address_flag field is a 1-bit Boolean flag, which indicates, when set, that the corresponding IP stream component is delivered through IP datagrams with target IP addresses different from the virtual_channel_target_IP_address. Furthermore, when the component_target_IP_address_flag is set, the receiving system (or receiver) uses the component_target_IP_address field as the target IP address for accessing the corresponding IP stream component. Accordingly, the receiving system (or receiver) will ignore the virtual_channel_target_IP_address field included in the num_channels loop.

The component_target_IP_address field corresponds to a 32-bit or 128-bit field. Herein, when the value of the IP_version_flag field is set to '0', the component_target_IP_address field indicates a 32-bit target IPv4 address associated to the corresponding IP stream component. And, when the value of the IP_version_flag field is set to '1', the component_target_IP_address field indicates a 128-bit target IPv6 address associated to the corresponding IP stream component.

The port_num_count field is a 6-bit field, which indicates the number of UDP ports associated with the corresponding IP stream component. A target UDP port number value starts from the target_UDP_port_num field value and increases (or is incremented) by 1. For the RTP stream, the target UDP port number should start from the target_UDP_port_num field value and shall increase (or be incremented) by 2. This is to incorporate RTCP streams associated with the RTP streams.

The target_UDP_port_num field is a 16-bit unsigned integer field, which represents the target UDP port number for the corresponding IP stream component. When used for RTP streams, the value of the target_UDP_port_num field shall correspond to an even number. And, the next higher value shall represent the target UDP port number of the associated RTCP stream.

The component_level_descriptor( ) represents zero or more descriptors providing additional information on the corresponding IP stream component.

The virtual_channel_level_descriptor( ) represents zero or more descriptors providing additional information for the corresponding virtual channel.

The ensemble_level_descriptor( ) represents zero or more descriptors providing additional information for the MH ensemble, which is described by the corresponding SMT.

FIG. 18 illustrates an exemplary bit stream syntax structure of an MH audio descriptor according to the present invention. When at least one audio service is present as a component of the current event, the MH_audio_descriptor( ) shall be used as a component_level_descriptor of the SMT. The MH_audio_descriptor( ) may be capable of informing the system of the audio language type and stereo mode status. If there is no audio service associated with the current event, then it is preferable that the MH_audio_descriptor( ) is considered to be insignificant (or absent) for the current event. Each field shown in the bit stream syntax of FIG. 18 will now be described in detail.

The descriptor_tag field is an 8-bit unsigned integer having a TBD value, which indicates that the corresponding descriptor is the MH_audio_descriptor( ). The descriptor_length field is also an 8-bit unsigned integer, which indicates the length (in bytes) of the portion immediately following the descriptor_length field up to the end of the MH_audio_descriptor( ). The channel_configuration field corresponds to an 8-bit field indicating the number and configuration of audio channels. The values ranging from '1' to '6' respectively indicate the number and configuration of audio channels as given for "Default bit stream index number" in Table 42 of ISO/IEC 13818-7:2006. All other values indicate that the number and configuration of audio channels are undefined.

The sample_rate_code field is a 3-bit field, which indicates the sample rate of the encoded audio data. Herein, the indication may correspond to one specific sample rate, or may correspond to a set of values that include the sample rate of the encoded audio data as defined in Table A3.3 of ATSC A/52B. The bit_rate_code field corresponds to a 6-bit field. Herein, among the 6 bits, the lower 5 bits indicate a nominal bit rate. More specifically, when the most significant bit (MSB) is '0', the corresponding bit rate is exact. On the other hand, when the most significant bit (MSB) is '0', the bit rate corresponds to an upper limit as defined in Table A3.4 of ATSC A/53B. The ISO_639_language_code field is a 24-bit (i.e., 3-byte) field indicating the language used for the audio stream component, in conformance with ISO 639.2/B [x]. When a specific language is not present in the corresponding audio stream component, the value of each byte will be set to '0x00'.

FIG. 19 illustrates an exemplary bit stream syntax structure of an MH RTP payload type descriptor according to the present invention.

The MH_RTP_payload_type_descriptor( ) specifies the RTP payload type. Yet, the MH_RTP_payload_type_descriptor( ) exists only when the dynamic value of the RTP_payload_type field within the num_components loop of the SMT is in the range of '96' to '127'. The MH_RTP_payload_type_descriptor( ) is used as a component_level_descriptor of the SMT.

The MH_RTP_payload_type_descriptor translates (or matches) a dynamic RTP_payload_type field value into (or with) a MIME type. Accordingly, the receiving system (or receiver) may collect (or gather) the encoding format of the IP stream component, which is encapsulated in RTP.

The fields included in the MH_RTP_payload_type_descriptor( ) will now be described in detail.

The descriptor_tag field corresponds to an 8-bit unsigned integer having the value TBD, which identifies the current descriptor as the MH_RTP_payload_type_descriptor( ).

The descriptor_length field also corresponds to an 8-bit unsigned integer, which indicates the length (in bytes) of the portion immediately following the descriptor_length field up to the end of the MH_RTP_payload_type_descriptor( ).

The RTP_payload_type field corresponds to a 7-bit field, which identifies the encoding format of the IP stream component. Herein, the dynamic value of the RTP_payload_type field is in the range of '96' to '127'.

The MIME_type_length field specifies the length (in bytes) of the MIME_type field.

The MIME_type field indicates the MIME type corresponding to the encoding format of the IP stream component, which is described by the MH_RTP_payload_type_descriptor( ).

FIG. 20 illustrates an exemplary bit stream syntax structure of an MH current event descriptor according to the present invention.

The MH_current_event_descriptor( ) shall be used as the virtual_channel_level_descriptor( ) within the SMT. Herein, the MH_current_event_descriptor( ) provides basic information on the current event (e.g., the start time, duration, and title of the current event, etc.), which is transmitted via the respective virtual channel.

The fields included in the MH_current_event_descriptor( ) will now be described in detail.

The descriptor_tag field corresponds to an 8-bit unsigned integer having the value TBD, which identifies the current descriptor as the MH_current_event_descriptor( ).

The descriptor_length field also corresponds to an 8-bit unsigned integer, which indicates the length (in bytes) of the portion immediately following the descriptor_length field up to the end of the MH_current_event_descriptor( ).

The current_event_start_time field corresponds to a 32-bit unsigned integer quantity. The current_event_start_time field represents the start time of the current event and, more specifically, as the number of GPS seconds since 00:00:00 UTC, Jan. 6, 1980.

The current_event_duration field corresponds to a 24-bit field. Herein, the current_event_duration field indicates the duration of the current event in hours, minutes, and seconds (wherein the format is in 6 digits, 4-bit BCD=24 bits).

The title_length field specifies the length (in bytes) of the title_text field. Herein, the value '0' indicates that there are no titles existing for the corresponding event.

The title_text field indicates the title of the corresponding event in event title in the format of a multiple string structure as defined in ATSC A/65C [x].

FIG. 21 illustrates an exemplary bit stream syntax structure of an MH next event descriptor according to the present invention.

The optional MH_next_event_descriptor( ) shall be used as the virtual_channel_level_descriptor( ) within the SMT. Herein, the MH_next_event_descriptor( ) provides basic information on the next event (e.g., the start time, duration, and title of the next event, etc.), which is transmitted via the respective virtual channel. The fields included in the MH_next_event_descriptor( ) will now be described in detail.

The descriptor_tag field corresponds to an 8-bit unsigned integer having the value TBD, which identifies the current descriptor as the MH_next_event_descriptor( ).

The descriptor_length field also corresponds to an 8-bit unsigned integer, which indicates the length (in bytes) of the portion immediately following the descriptor_length field up to the end of the MH_next_event_descriptor( ).

The next_event_start_time field corresponds to a 32-bit unsigned integer quantity. The next_event_start_time field represents the start time of the next event and, more specifically, as the number of GPS seconds since 00:00:00 UTC, Jan. 6, 1980.

The next_event_duration field corresponds to a 24-bit field. Herein, the next_event_duration field indicates the duration of the next event in hours, minutes, and seconds (wherein the format is in 6 digits, 4-bit BCD=24 bits).

The title_length field specifies the length (in bytes) of the title_text field. Herein, the value '0' indicates that there are no titles existing for the corresponding event.

The title_text field indicates the title of the corresponding event in event title in the format of a multiple string structure as defined in ATSC A/65C [x].

FIG. 22 illustrates an exemplary bit stream syntax structure of an MH_system_time_descriptor according to the present invention.

The MH_system_time_descriptor( ) shall be used as the ensemble_level_descriptor( ) within the SMT. Herein, the MH_system_time_descriptor( ) provides information on current time and date.

The MH_system_time_descriptor( ) also provides information on the time zone in which the transmitting system (or transmitter) transmitting the corresponding broadcast stream is located, while taking into consideration the mobile/portable characterstics of the MH service data. The fields included in the MH_system_time_descriptor( ) will now be described in detail.

The descriptor_tag field corresponds to an 8-bit unsigned integer having the value TBD, which identifies the current descriptor as the MH_system_time_descriptor( ).

The descriptor_length field also corresponds to an 8-bit unsigned integer, which indicates the length (in bytes) of the portion immediately following the descriptor_length field up to the end of the MH_system_time_descriptor( ).

The system_time field corresponds to a 32-bit unsigned integer quantity. The system_time field represents the current system time and, more specifically, as the number of GPS seconds since 00:00:00 UTC, Jan. 6, 1980.

The GPS_UTC_offset field corresponds to an 8-bit unsigned integer, which defines the current offset in whole seconds between GPS and UTC time standards. In order to convert GPS time to UTC time, the GPS_UTC_offset is subtracted from GPS time. Whenever the International Bureau of Weights and Measures decides that the current offset is too far in error, an additional leap second may be added (or subtracted). Accordingly, the GPS_UTC_offset field value will reflect the change.

The time_zone_offset_polarity field is a 1-bit field, which indicates whether the time of the time zone, in which the broadcast station is located, exceeds (or leads or is faster) or falls behind (or lags or is slower) than the UTC time. When the value of the time_zone_offset_polarity field is equal to '0', this indicates that the time on the current time zone exceeds the UTC time. Therefore, the time_zone_offset_polarity field value is added to the UTC time value. Conversely, when the value of the time_zone_offset_polarity field is equal to '1', this indicates that the time on the current time zone falls behind the UTC time. Therefore, the time_zone_offset_polarity field value is subtracted from the UTC time value.

The time_zone_offset field is a 31-bit unsigned integer quantity. More specifically, the time_zone_offset field represents, in GPS seconds, the time offset of the time zone in which the broadcast station is located, when compared to the UTC time.

The daylight_savings field corresponds to a 16-bit field providing information on the Summer Time (i.e., the Daylight Savings Time). The time_zone field corresponds to a (5×8)-bit field indicating the time zone, in which the transmitting system (or transmitter) transmitting the corresponding broadcast stream is located.

Figure 23:
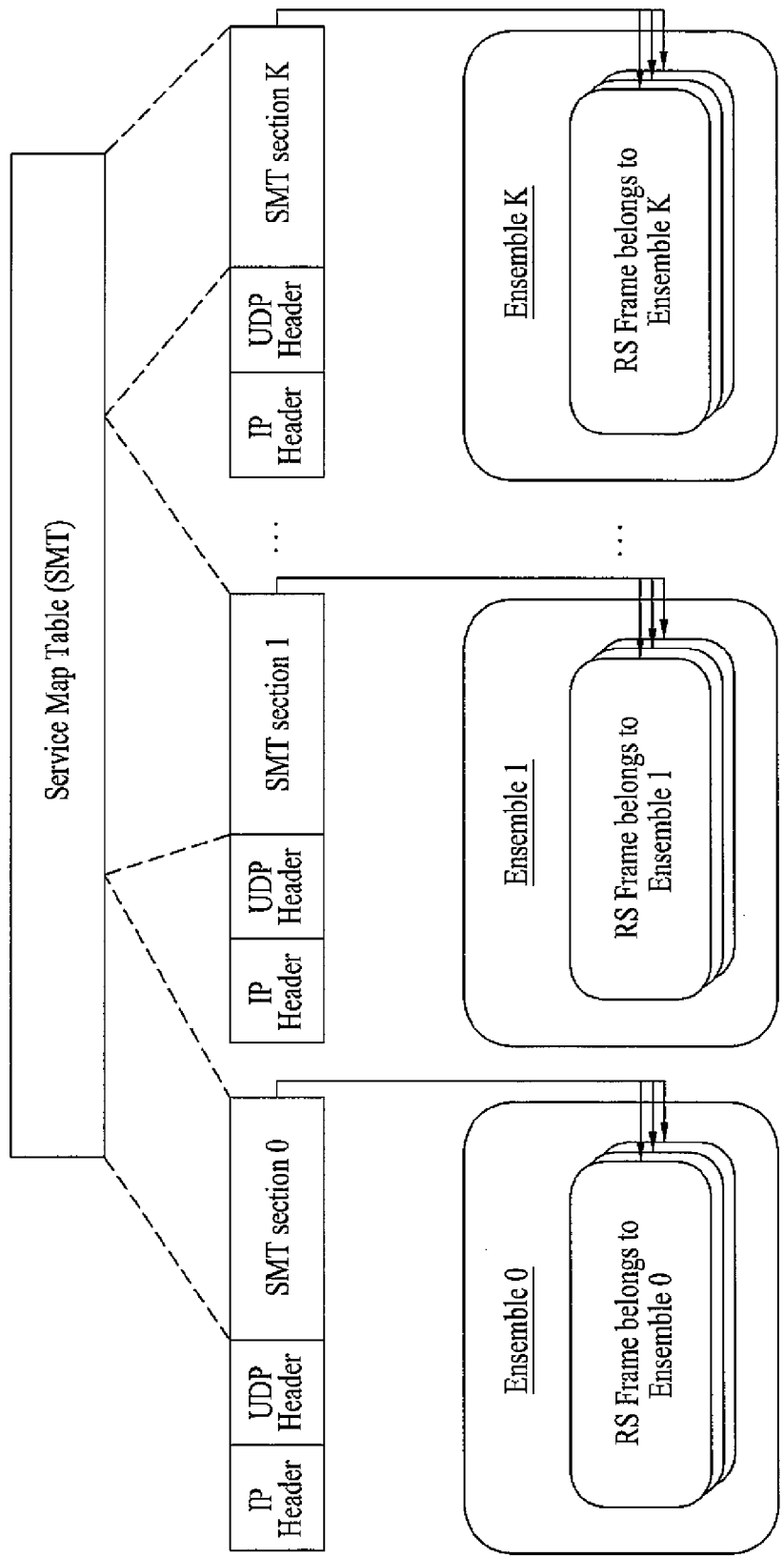
FIG. 23 illustrates segmentation and encapsulation processes of a service map table according to the present invention.

FIG. 23 illustrates segmentation and encapsulation processes of a service map table (SMT) according to the present invention.

According to the present invention, the SMT is encapsulated to UDP, while including a target IP address and a target UDP port number within the IP datagram.

More specifically, the SMT is first segmented into a predetermined number of sections, then encapsulated to a UDP header, and finally encapsulated to an IP header. In addition, the SMT section provides signaling information on all virtual channel included in the MH ensemble including the corresponding SMT section. At least one SMT section describing the MH ensemble is included in each RS frame included in the corresponding MH ensemble. Finally, each SMT section is identified by an ensemble_id included in each section. According to the embodiment of the present invention, by informing the receiving system of the target IP address and target UDP port number, the corresponding data (i.e., target IP address and target UDP port number) may be parsed without having the receiving system to request for other additional information.

Figure 24:
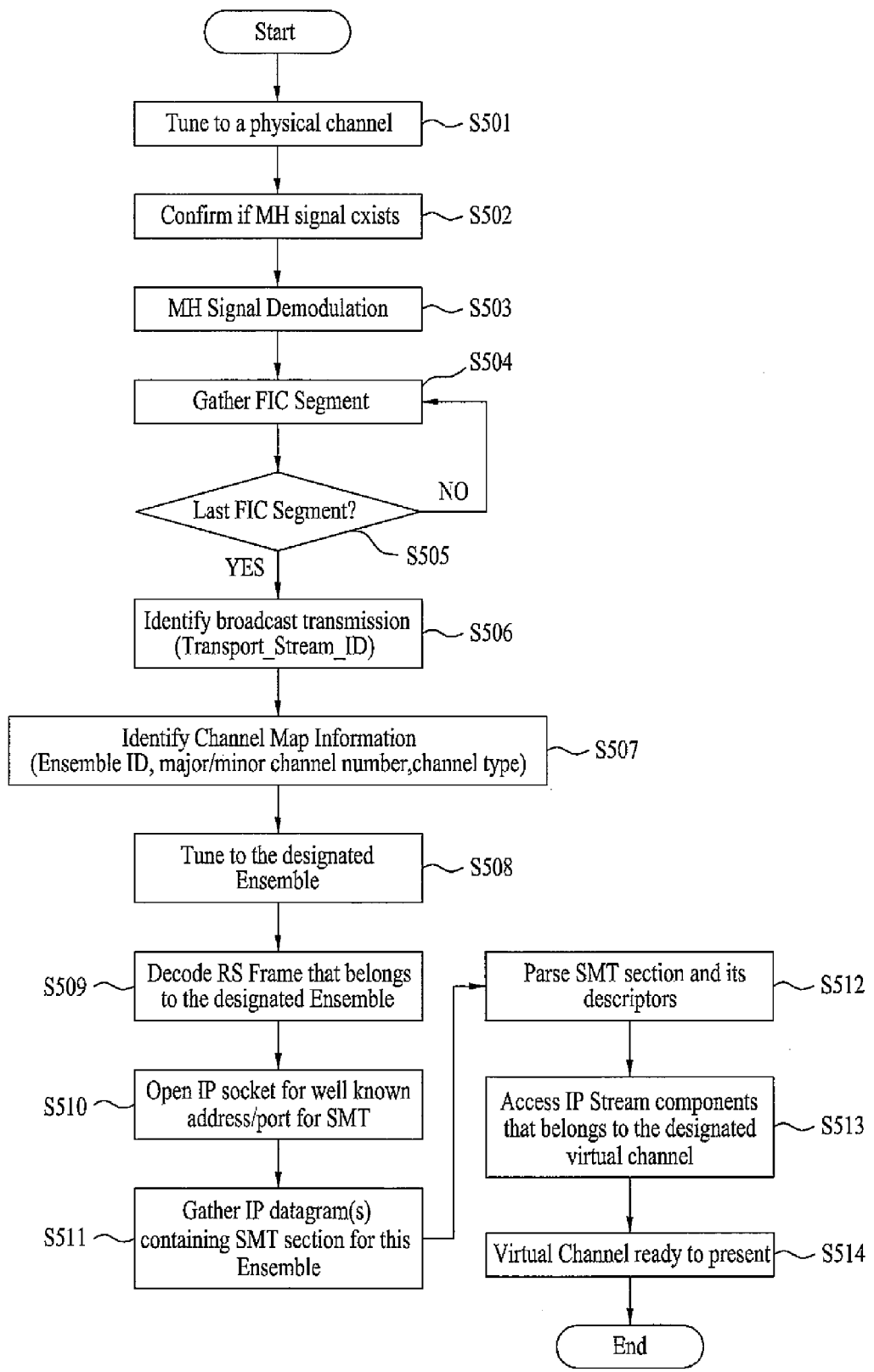
FIG. 24 illustrates a flow chart for accessing a virtual channel using FIC and SMT according to the present invention.

FIG. 24 illustrates a flow chart for accessing a virtual channel using FIC and SMT according to the present invention.

More specifically, a physical channel is tuned (S501). And, when it is determined that an MH signal exists in the tuned physical channel (S502), the corresponding MH signal is demodulated (S503). Additionally, FIC segments are grouped from the demodulated MH signal in sub-frame units (S504 and S505).

According to the embodiment of the present invention, an FIC segment is inserted in a data group, so as to be transmitted. More specifically, the FIC segment corresponding to each data group described service information on the MH ensemble to which the corresponding data group belongs. When the FIC segments are grouped in sub-frame units and, then, deinterleaved, all service information on the physical channel through which the corresponding FIC segment is transmitted may be acquired. Therefore, after the tuning process, the receiving system may acquire channel information on the corresponding physical channel during a sub-frame period. Once the FIC segments are grouped, in S504 and S505, a broadcast stream through which the corresponding FIC segment is being transmitted is identified (S506). For example, the broadcast stream may be identified by parsing the transport_stream_id field of the FIC body, which is configured by grouping the FIC segments.

Furthermore, an ensemble identifier, a major channel number, a minor channel number, channel type information, and so on, are extracted from the FIC body (S507). And, by using the extracted ensemble information, only the slots corresponding to the designated ensemble are acquired by using the time-slicing method, so as to configure an ensemble (S508).

Subsequently, the RS frame corresponding to the designated ensemble is decoded (S509), and an IP socket is opened for SMT reception (S510).

According to the example given in the embodiment of the present invention, the SMT is encapsulated to UDP, while including a target IP address and a target UDP port number within the IP datagram. More specifically, the SMT is first segmented into a predetermined number of sections, then encapsulated to a UDP header, and finally encapsulated to an IP header. According to the embodiment of the present invention, by informing the receiving system of the target IP address and target UDP port number, the receiving system parses the SMT sections and the descriptors of each SMT section without requesting for other additional information (S511).

The SMT section provides signaling information on all virtual channel included in the MH ensemble including the corresponding SMT section. At least one SMT section describing the MH ensemble is included in each RS frame included in the corresponding MH ensemble. Also, each SMT section is identified by an ensemble_id included in each section.

Furthermore each SMT provides IP access information on each virtual channel subordinate to the corresponding MH ensemble including each SMT. Finally, the SMT provides IP stream component level information required for the servicing of the corresponding virtual channel.

Therefore, by using the information parsed from the SMT, the IP stream component belonging to the virtual channel requested for reception may be accessed (S513). Accordingly, the service associated with the corresponding virtual channel is provided to the user (S514).

The Relation of Fast Information Channel Data and Other Data

As illustrated above, the MH broadcast signal, in which the main service data and the mobile service data are multiplexed, is transmitted. The transmission parameter channel signaling information is allocated in the TPC data, the fast information channel signaling information is allocated in the FIC data.

The TPC data and the FIC data are multiplexed and the multiplexed TPC data and the FIC data are randomized. And the randomized data are error-correction-encoded by a ¼ Parallel Concatenated Convolutional Code (PCCC) encoding scheme and the encoded data transmitted in a data group.

Meanwhile, the mobile service data in an ensemble is error-correction-encoded by a Serial Concatenated Convolutional Code (SCCC) outer encoding scheme and the encoded data transmitted in the data group.

The mobile service data includes content data for providing a service and service table information describing the service. The service table information includes channel information of an ensemble, which means a group of at least one channel, and service description information with respect to the channel information.

Hereinafter, for convenience of description, when data units in the same data group are processed by different modulation/demodulation schemes, it is described that the respective data units are transmitted by way of different data channels, For example, both the TPC data and the FIC data are transmitted by way of a first channel different from a second channel in which the content data and the service description information in an ensemble are transmitted. Because the TPC data and the FIC data are processed by different modulation/demodulation schemes from those of the content data and the service description information.

Under this assumption, a process by which the MH broadcast signal is received is described. First, the mobile service data and the main service data are received in a broadcast signal. A version of the FIC data is obtained from the TPC data in the mobile service data, and the binding information of an ensemble and a virtual channel of the ensemble is obtained from the FIC data. Accordingly, it is known that which ensemble has the channel a user selects.

And the ensemble transferring the corresponding channel is received though a parade of the broadcast signal. The data group can be obtained from the parade received by the receiver, a RS frame including the ensemble is obtained after gathering data groups from one MH frame. Then the RS frame is decoded and service table information in the decoded RS frame is parsed. The information describing the virtual channel the user wants to watch is obtained from the parsed service table information and then a service is provided from the virtual channel.

The FIC data from a first data channel represents binding information of an ensemble and a virtual channel, which are transmitted from a second data channel. Using the binding information, the service is provided more quickly by parsing the service table information.

If the main service data and the multiplexed mobile service data are received, an embodiment for processing mobile service data at a constant bitrate and another embodiment will hereinafter be described. In this another embodiment, digital broadcast reception systems synchronize mobile services contained in the broadcast signal are synchronized and displayed, and components contained in the mobile service contents are synchronized and displayed.

Figure 25:
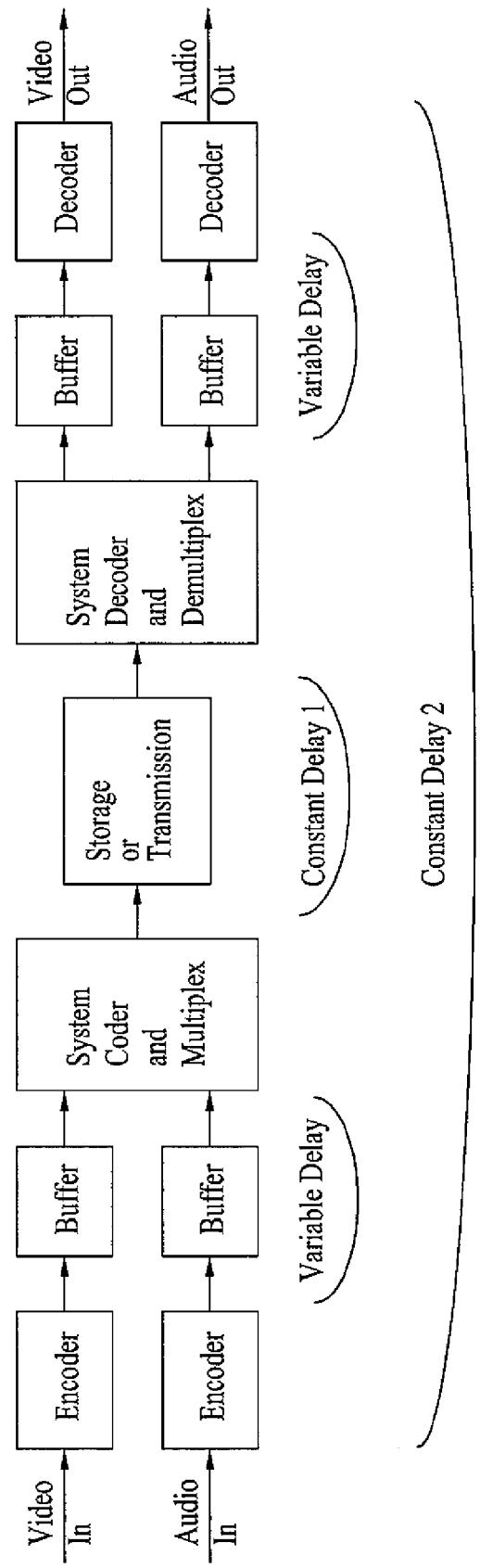
FIG. 25 shows a timing model.

FIG. 25 shows a timing model. If video components and audio components are transmitted, an example for synchronizing two components is as follows.

Each of the video component and the audio component is encoded, such that the encoded components can be stored in buffers of the data processing system and the transmission system.

Audio/video components stored in buffers of the data processing system or the transmission system are encoded and multiplexed, such that the multiplexed signals may be stored or transmitted.

A playback system or a reception system may decode or demultiplex multiplexed video/audio signals stored in the buffers. The demultiplexed video component or the demultiplexed audio component is stored in the buffer of the playback system or the reception system, such that the resulting video and audio components are decoded by individual decoders.

The video and audio components to be synchronized in the above-mentioned signal processing flow undergo different time delays. For example, it is assumed that this timing model has a first constant time delay generated when data is stored in or transmitted to the storage apparatus. This time delay is represented by "Constant Delay 1" in FIG. 25

A specific time, during which data is temporarily stored in the buffer of a data processing system, a transmission system, a playback system, or a reception system, may be differently decided according to system types, such that the video/audio components are time-delayed in different ways. This time delay is represented by "Variable Delay" in FIG. 25

However, in order to synchronize the video/audio components and output the synchronized components, it is assumed that another time delay is constant until the video and audio components enter the timing model and are then outputted from the timing model. This time delay is represented by "Constant Delay 2" in FIG. 25.

Since the above-mentioned timing model is not operated, the video/audio components are not synchronized with each other, such that the user may feel uncomfortable if he or she receives content data including video/audio components. In order to solve this problem, the MPEG-2 TS system defines a system time clock as the value of 27 MHz, and the video/audio components are synchronized with each other.

In accordance with contents prescribed in the MPEG-2 TS system, a transmission system, performs PCR (Program Clock Reference)-coding on a system time clock frequency, and transmits the coded result to the reception system. This PCR value indicates a transmission system time as the value of 27 MHz in a field 'program_clock_reference_base_field' of the MPEG-2 TS.

The reception system sets a reception time of the last bit of the field 'program_clock_reference_base_field' to a system time clock (STC). If the STC value corrected by the PCR is equal to a decoding time stamp (DTP) and a presentation time stamp (PTS) contained in a packetized elementary stream (PES), a corresponding elementary stream is decoded, and the decoded elementary stream is output to an external part.

It is assumed that a system time clock error range of 27 MHz in the MPEG-2 TS system is set to +/−810 MHz, and successive PCR values are transmitted within 0.1 second.

In the digital broadcast reception system, input signals of the MPEG-2 system decoder are used as output signal of a tuner or a channel decoder. In order to maintain a constant bitrate of a broadcast stream during the processing time of broadcast signals, all the constituent components of the digital broadcast reception system are operated. If mobile service data such as MH broadcast signals is discontinuously received on a time axis, a digital broadcast reception system is able to reduce an amount of power consumption using the time slicing scheme.

Figure 26:
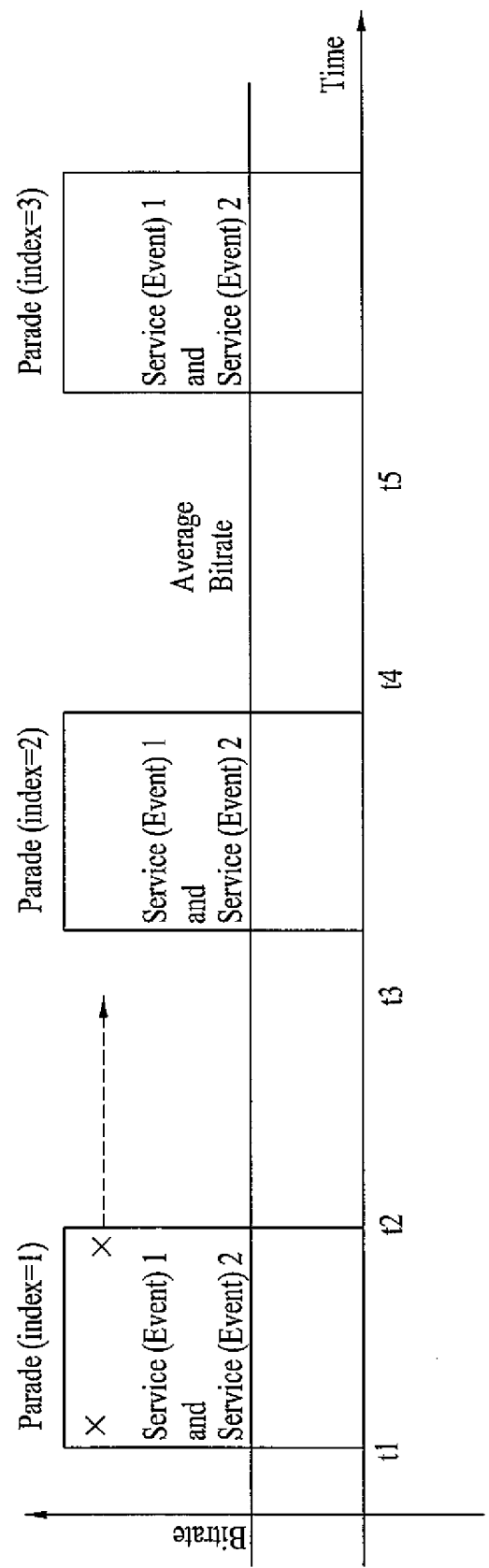
FIG. 26 shows a bit rate varying with time while signals are transmitted and received according to a time slicing technique.

FIG. 26 shows time-variant bitrates provided when signals are transmitted and received by the time slicing scheme. For example, if a first service event (service 1) and a second service event (service 2) are received by a parade of MH broadcast signals (i.e., if the first and second service events are received in the order of Parade Index 1, Parade Index 2, and Parade Index 3), the amount of transmitted broadcast signals is not constant with time. It is assumed that the same data quantity as that of the above case in which the digital broadcast reception system receives mobile service data using the time slicing scheme is received at an average bitrate. It is assumed that a bandwidth of the mobile service data received by the time slicing scheme is larger than a bandwidth of the other case capable of receiving data at the average bitrate by N times. If data is received according to the two schemes, it is assumed that an amount of data for use in one scheme is equal to that of the other scheme.

Thus, although an amount of data for use in one case in which the digital broadcast reception system receives broadcast signals using the time slicing scheme is equal to that of the other case in which the digital broadcast reception system continuously receives broadcast signals, an amount of power consumption of the one case is less than that of the other case by 1/N+a.

However, if broadcast signals are received in the form of a parade according to the time slicing scheme, the digital broadcast reception system is unable to receive the broadcast signals at a constant bitrate. So, if the broadcast signals are continuously received, decoded and outputted, the digital broadcast reception system may have difficulty in managing its own buffer. For example, if the time reference value is encoded at times t1 and t2 (denoted by X) and data is transmitted by the MPEG-2 TS scheme, the encoded time reference field value may be different from an actual system time reference. For example, a time reference value encoded at the t2 time may correspond to a time reference value obtained at a t3 time on the condition that broadcast signals are received at an average bitrate. If the time reference value are transmitted and received by the above scheme, an additional buffer may be installed in the digital broadcast reception system, broadcast signals received in the form of a parade may be stored in this additional buffer, and the resulting broadcast signals may be outputted at an average bitrate.

However, this scheme is very complicated, and serves as a recursive process which may continuously accumulate unexpected errors in a process capable of recovering an original time reference time at an average bitrate, such that the broadcast reception system becomes unstable.

Although the time reference value may be recovered by the above scheme, the recovered time reference value may be changed with time at which a decoder of the digital broadcast reception system decodes broadcast signals. So, although the same digital broadcast reception system is used, the recovered time reference value may be unexpectedly changed to another. For example, if the digital broadcast reception system may be powered on, or if a current channel is changed to another channel, an unexpected time difference may occur in a playback time of contents.

Figure 27:
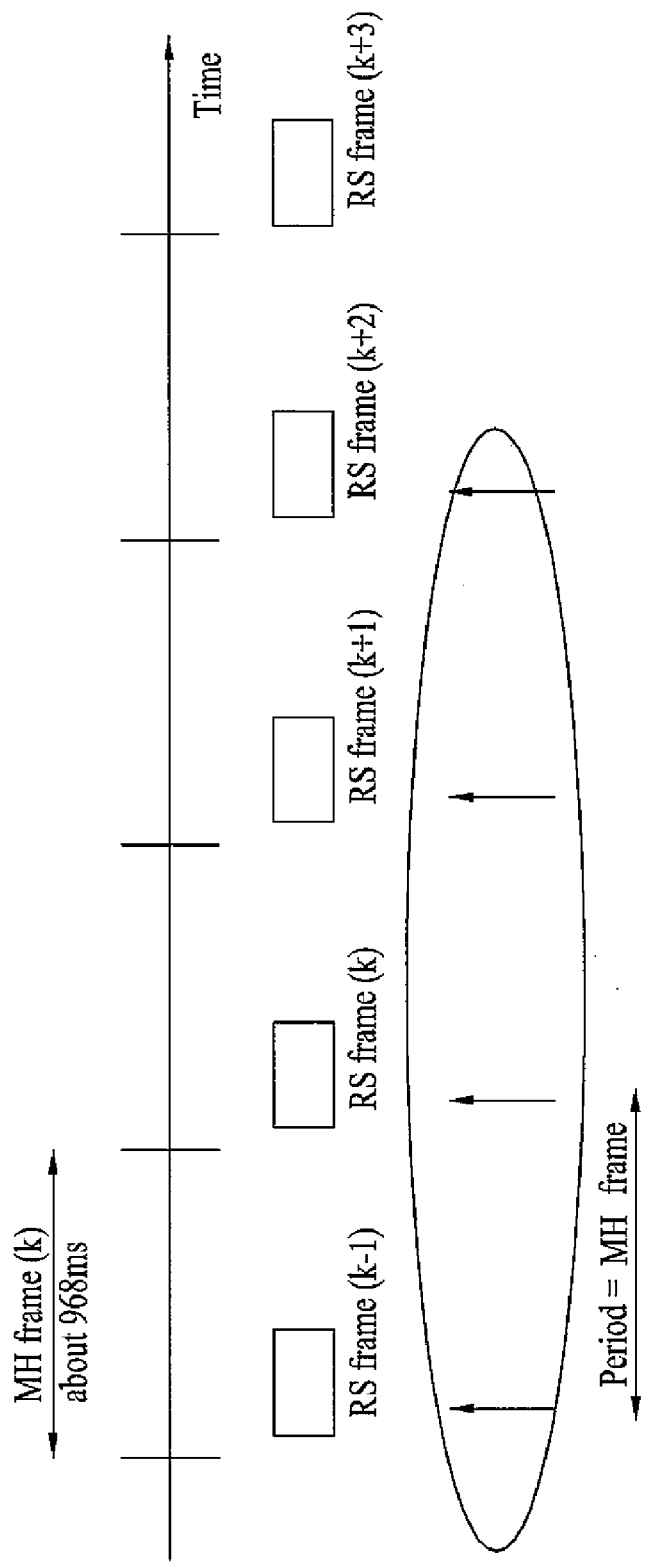
FIG. 27 is a conceptual diagram illustrating a method for processing a reception (Rx) signal at a constant data processing rate.

FIG. 27 is a conceptual diagram illustrating an embodiment for processing a reception signal at a constant data processing rate. In FIG. 27, a horizontal axis is a time axis, and each unit marked on the time axis is a unit for transmitting/receiving the MH broadcast signal.

A time unit at the MH frame corresponding to 20 VSB frames is 0.968 ms. The time of 0.968 ms is a time unit where a baseband processor of the digital broadcast reception system processes broadcast signals.

As shown in FIG. 27, if the K-th MH frame (i.e., MH frame (H)) is received, the system can acquire the K-th RS frame (i.e., RS frame (K)) transmitted to the MH frame after the lapse of the time 0.968 ms. The digital broadcast reception system stores the RS frame in a storage unit, and displays mobile service data provided as the broadcast signals.

A baseband processor of the digital broadcast reception can recognize the beginning part and the end part of each MH frame. The end part of any one of the MH frames is equal to the beginning part of the next MH frame following the above MH frame. The baseband processor of the digital broadcast reception system is synchronized with a modulator of a digital broadcast transmission system, such that a modulator of the digital broadcast transmission system modulates each MH frame at intervals of the time 0.968 ms and outputs the resulting MH frame. Therefore, the digital broadcast reception system and the digital broadcast transmission system processes broadcast signals at intervals of a constant time, the buffer of the digital broadcast reception system can process data at a constant data rate without any overflow or underfloor. In order to allow each of the digital broadcast reception system and the digital broadcast transmission system to process data at the constant data processing rate, the digital broadcast transmission system can transmit reference time information used as a data processing reference to the digital broadcast reception system. The digital broadcast reception system(s) can receive reference time information contained in broadcast signals, and can process the received broadcast signals according to the reference time information. Accordingly, the digital broadcast reception system can process data at the same data processing rate as that of the digital broadcast transmission system, and a plurality of digital broadcast reception systems can simultaneously display the same contents. For the convenience of description and better understanding of the present invention, the reference time information at which the digital broadcast reception system is driven is called reference time information.

Arrows marked at a lower part of FIG. 27 indicate time at which reference time information is established at each MH frame. For example, the digital broadcast reception system may set reference time information, which has been contained in a frame (e.g., RS frame) of the mobile service data on the basis of the MH frame, to a system time clock of the digital broadcast reception system. The digital broadcast reception system may set reference time information contained in a frame of mobile service data acquired at intervals of the MH frame to the system time clock at intervals of the MH frame.

The above-mentioned description shows the RS frame used as the mobile service data frame. In case of the MH broadcast signal, the digital broadcast reception system receives one RS frame at intervals of 968 msec, such that the reference time information may be established at intervals of 968 msec. Therefore, if the reception system receives the (K+1)-th MH frame, it acquires the (K+1)-th RS frame and sets the reference time information in an IP datagram contained in the RS frame to a system time clock. If the reception system receives the (K+2)-th MH frame, it acquires the (K+2)-th RS frame and sets the reference time information in an IP datagram contained in the RS frame to a system time clock. The digital broadcast reception system periodically establishes this system time clock. In the example of FIG. 27, after the RS frame is received and reference time information contained in the received RS frame is acquired, the acquired reference time information is set to the system time clock.

For example, the reference time information acquired from an IP datagram contained in the K-th RS frame may be set to the system time clock at the beginning time of the (K+2)-th MH frame.

For example, the digital broadcast reception system may establish the reference time information at the beginning or end time of a specific MH subframe from among MH frames.

For another example, in case of the MH broadcast system, the digital broadcast reception system may establish the system time clock at intervals of the MH subframe. In accordance with the exemplary MH broadcast signal frame, 5 MH subframes are contained in the MH broadcast signal frame. If MH reference times are contained in the RS frame, individual reference times may be sequentially set to the system time clock at the beginning time (or the end time) of the MH subframe.

Reference time information contained in the mobile service data frame can be periodically established in association with the MH signal frame, and need not be always set to the beginning or end time of the MH frame or the MH subframe.

The reference time information may indicate an absolute time such as a network time protocol (NTP) timestamp. If the service is transmitted and received using the Internet protocol shown in FIG. 3, service constituent components indicating audio/video data are configured in the form of real time transport protocol (RTP) packets, and are transmitted and received. The RTP packet header may be a timestamp used as a time unit at which an access unit (AU) such as a video frame is processed. As reference time information of the timestamp, a network time protocol (NTP) timestamp, which is an absolute time in a sender report (SR) according to RTP control protocol (RTCP), and a timestamp value of a reference clock of a system corresponding to the NTP timestamp can be simultaneously transmitted.

The digital broadcast reception system is able to set the NTP timestamp in an IP datagram contained in the mobile service data frame to the system time clock at a specific time of the frame. Herein, the NTP timestamp may be in the mobile service data frame, and it is not necessary that the NTP timestamp should be contained in the SR according to the RTCP.

The digital broadcast reception system may establish synchronization of audio/video data received as the reference time information contained in the mobile service data frame. A plurality of reception systems establish the system time clock using the same reference time information, such that they are synchronized with each other and display contents transmitted as broadcast signals.

For example, if the digital broadcast reception system receives the MH broadcast signal, a specific time for the MH signal processing (e.g., the beginning time of the MH signal frame or the beginning time of any one of MH signal frames) may be used as a time for establishing the reference time. In this example, the MH frame start time of the MH signal frame may be used as the reference time setup time. If the start time of the MH signal frame is used as the reference time setup time and the Doppler effect is ignored, the digital broadcast reception system receiving the MH broadcast signals may establish the reference time at the same time as the above reference time setup time. Also, the actual reference time value transmitted to the MH signal frame may be set to a system time clock at the same time as the above reference time setup time.

The digital broadcast reception system uses the NTP timestamp value as reference time information, such that this reference time information can be used as a common wall clock which can be referred at a playback or decoding time of the service. Also, this reference time information may be interoperable with the other NTP timestamp transmitted as sender report (SR) packets of the RTCP on the IP layer.

Figure 28:
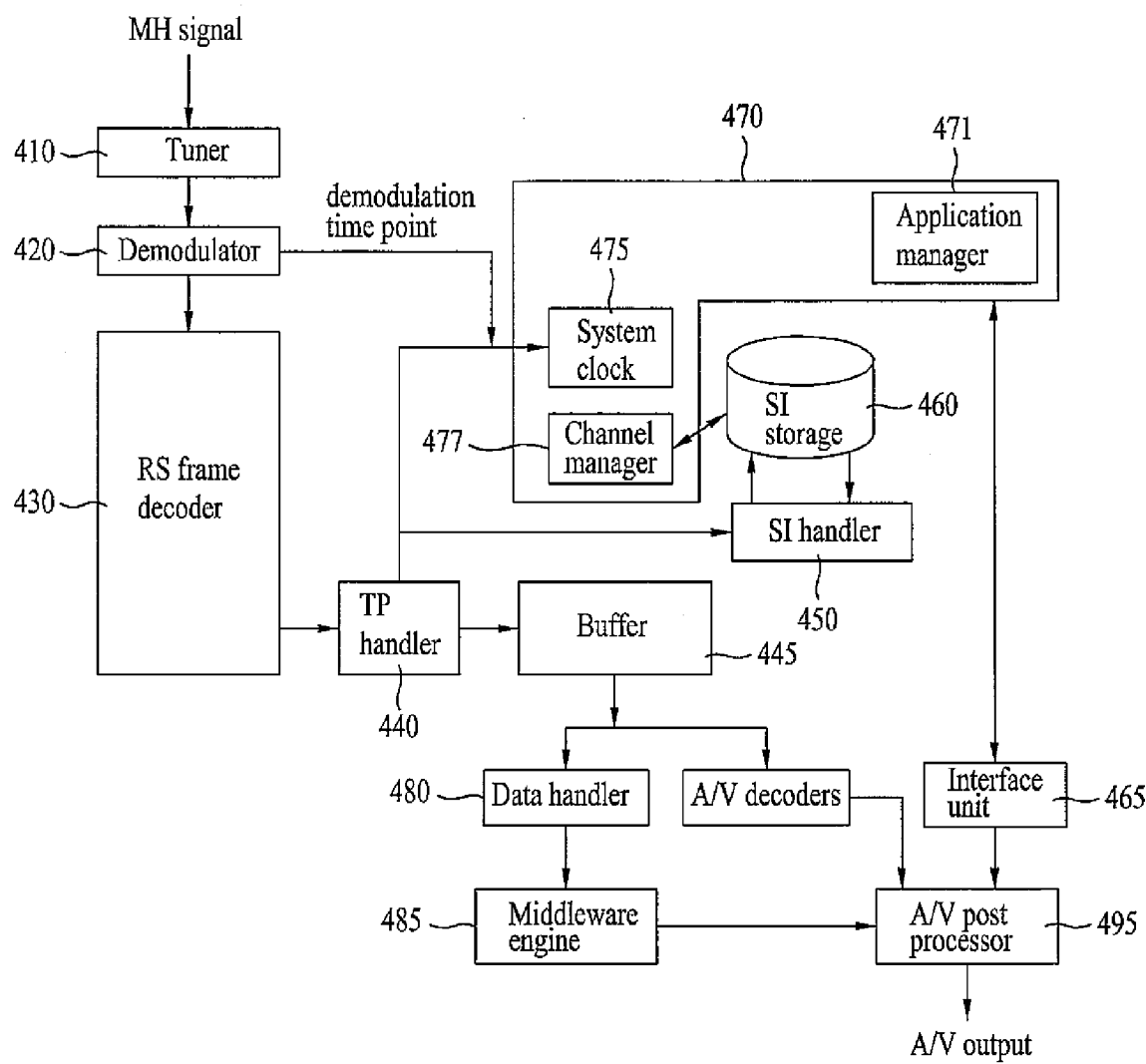
FIG. 28 is a conceptual diagram illustrating a digital broadcast reception system according to another embodiment of the present invention.

FIG. 28 is a block diagram illustrating a digital broadcast reception system according to another embodiment of the present invention.

Referring to FIG. 28, a tuner 410 receives a broadcast signal(s). The broadcast signal may be a signal in which mobile service data and main service data are multiplexed. Exemplary broadcast signals are shown in FIGS. 2 to 12.

A demodulator 420 demodulates a reception signal(s). If the reception signal is the MH signal frame, the demodulator 420 can output the beginning time (i.e., MH frame start) of the MH signal frame or the beginning time of each subframe of the MH signal frame. That is, the demodulator 420 can output a demodulation time of a specific position of the received signal. The demodulator 420 extracts TPC or FIC data from the MH signal frame, and outputs the extracted TPC or FIC data, and outputs the RS frame including ensembles of mobile service data.

The RS frame decoder 430 decodes the RS frame of FIG. 3, and outputs MH transport packets contained in the decoded RS frame to the transport packet (TP) handler 440. The TP contained in the MH broadcast signal may have an IP datagram, which includes service table information of FIG. 17, mobile service data acting as content data, and reference time information. In the above-mentioned example, the NTP timestamp is shown as reference time information. The TP handler 440 can output each of mobile service data, service table information, and reference time information contained in the IP datagram.

The outputted mobile service data is temporarily stored in a buffer 445, and the service table information is outputted to the SI handler 450. The reference time information is outputted to the system clock manager 475 contained in the manager 470.

The SI handler 450 decodes service table information generated from the TP handler 440. In the above-mentioned example, the SMT is shown as service table information. The decoded service table information is stored in the service table information storage unit 460.

For example, the manager 470 receives demodulation time information of the output signal frame of the demodulator. At this demodulation time according to the demodulation time information, the manager 470 determines reference time information to be a system time clock of the digital broadcast reception system. The manager 470 can control the SI handler 450, the data handler 480, and the A/V decoder 490, such that data contained in the buffer 445 can be processed according to the determined system time clock at a constant bitrate.

A channel manager 477 of the manager 470 can generate a channel map using service table information stored in the service table information storage unit 460. The channel manager 477 forms the channel map according to binding information indicating the relationship between an ensemble for transmitting a user-selected service and a virtual channel contained in this ensemble. The channel manager 477 selects a broadcast channel to quickly output the virtual channel including the user-selected service, such that broadcast service of the selected channel is displayed.

The data handler 480 processes data broadcast download data contained in the buffer 445 according to a periodically-established system time clock. A middleware engine 485 processes the output data of the data handler 480 according to a periodically-recovered system time clock, and provides a data broadcast application with the resulting data. For example, the data broadcast data passes through the A/V post-processor 495 by On-Screen-Display (OSD), and the resulting broadcast data is outputted to a user.

The A/V decoder 490 decodes mobile service data contained in the buffer 445 according to the periodically-established system time clock, and outputs the decoded mobile service data. The A/V decoder 490 outputs the decoded video/audio data to the A/V post-processor 495. The interface unit 465 receives various control signals (e.g., a channel shifting signal, an application driving signal) for managing/establishing the digital broadcast system from the user, and outputs the received control signals to the manager 440 or the A/V post-processor 495.

The A/V post-processor 495 allows the A/V data to be received in the A/V decoder 490, and allows the received A/V data to be displayed. The A/V post-processor 495 may output the A/V data to the interface unit 465 according to a control signal. The A/V data generated from the A/V post-processor 495 is provide to the user via the display (not shown). The display can provide the user with the audio/video data according to a system time clock recovered by the reference time decided by the above-mentioned scheme. The manager 470 controls the A/V post-processor 495 to synchronize audio/video data according to the NTP timestamp established at a specific position of the received signal frame. Upon receiving a control signal from the manager 470, the display outputs the synchronized audio/video data to the user. Thus, the embodiment of FIG. 28 may correspond to the embodiment of FIG. 1. The reference time used as the NTP timestamp value may be periodically restored and used as a system time clock at a specific time of the MH signal frame.

Figure 29:
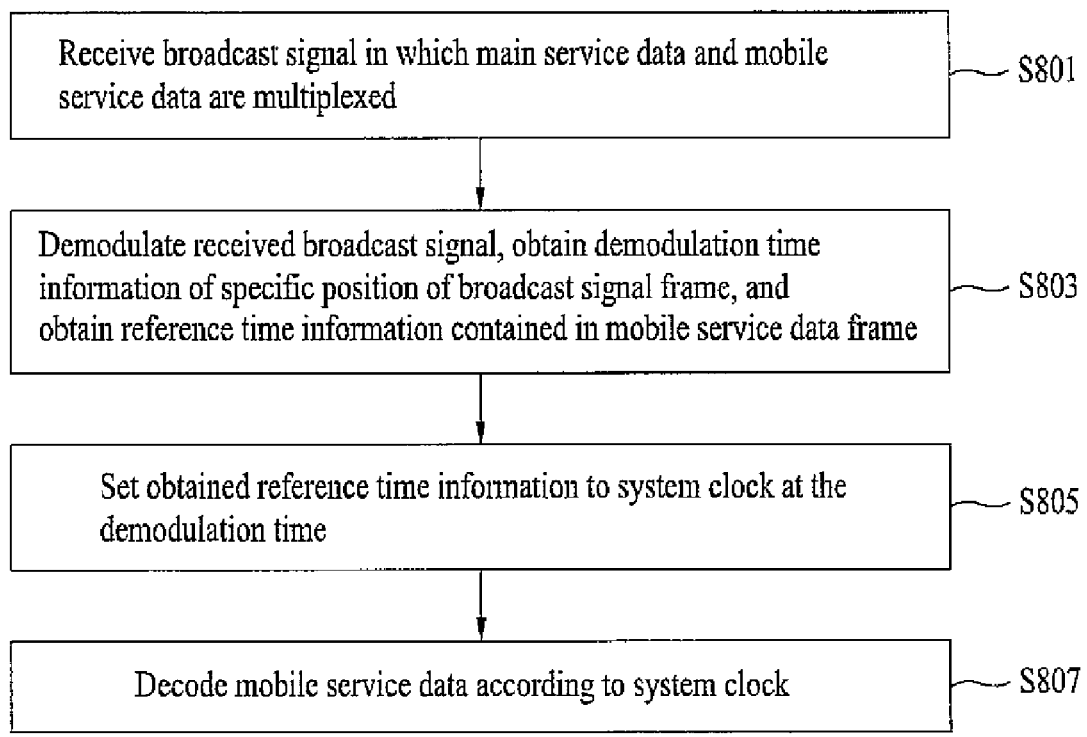
FIG. 29 is a flow chart illustrating a data processing method according to the present invention.

FIG. 29 is a flow chart illustrating a data processing method.

Referring to FIG. 29, the broadcast system receives a signal in which main service data and mobile service data are multiplexed at step S801. As an example of the multiplexed resultant signal, the MH broadcast signal can be used as an example of the multiplexed resultant signal. The mobile service data may be discontinuously received with time.

The system demodulates the received broadcast signal, obtains demodulation time information of a specific position, and obtains reference time information contained in the mobile service data frame at step S803. For example, demodulation time information of a specific position of the frame may be the beginning time of the MH signal frame or the beginning time of each subframe of the MH signal frame. The demodulation time information can be periodically repeated.

The system determines the obtained reference time information to be a system clock at the above demodulation time at step S805.

The system decodes the mobile service data according to the determined system clock at step S807.

Thus, the received broadcast signal may be decoded or displayed according to the reference time decided at a specific time. As a result, although mobile service data is discontinuously received, data can be processed at a constant bitrate.

As apparent from the above description, the digital broadcast system and the data processing method according to the present invention have strong resistance to any errors encountered when mobile service data is transmitted over the channel, and can be easily compatible with the conventional receiver. The digital broadcast system according to the present invention can normally receive mobile service data without any errors over a poor channel which has lots of ghosts and noises. The digital broadcast system according to the present invention inserts known data at a specific location of a data zone, and performs signal transmission, thereby increasing the Rx performance under a high-variation channel environment.

Also, the present invention can process service data, which is discontinuously received with time, at a constant bitrate.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of transmitting a broadcast signal in a transmitter, the method comprising:

transmitting, at a transmitting unit, a transmission frame including a plurality of slots during which data groups of mobile data are transmitted, the mobile data being encoded through a Reed-Solomon (RS) frame, each of the data groups including a plurality of regions, each of the regions including a plurality of data blocks, each of the data blocks including contiguous Vestigial Sideband (VSB) data segments, wherein a first region and a second region in the data group include at least three known data sequences which are spaced apart by regular VSB data segments, and the first region further includes signaling information of the mobile data in specified VSB data segments, wherein the signaling information includes first channel information providing binding information between a mobile service identifier and an ensemble being a collection of services of the mobile data, and second channel information describing the transmission frame and the data groups, wherein the second channel information provides an identification number of the ensemble, wherein the ensemble includes a first signaling table describing a service, wherein the first signaling table includes a service map table (SMT) providing Internet Protocol (IP) address information and IP component level information for the service, and wherein the service is signaled by hierarchical signaling information which includes ensemble access information in the second channel information and IP level service access information in the SMT.

2. The method of claim 1, wherein the SMT includes a flag indicating whether or not the IP address information is an IPv4 address.

3. The method of claim 2, wherein, when the flag is set to 0 (zero), the IP address information is an IPv4 address, and, when the flag is set to 1, the IP address information is an IPv6 address.

4. The method of claim 1, wherein each row of a payload of the RS frame includes a transport packet of the mobile data, the transport packet including an IP datagram having a network time protocol (NTP) timestamp.

5. A method of receiving a broadcast signal in a receiver, the method comprising:

receiving, at a tuner, a transmission frame including a plurality of slots during which data groups of mobile data are received, the mobile data being data encoded through a Reed-Solomon (RS) frame, each of the data groups including a plurality of regions, each of the regions including a plurality of data blocks, each of the data blocks including contiguous Vestigial Sideband (VSB) data segments, wherein a first region and a second region in the data group include known data sequences which are spaced regular VSB data segments apart, and the first region further includes a known data sequence and signaling information of the mobile data in specified VSB data segments, wherein the signaling information includes first channel information providing binding information between a mobile service identifier and an ensemble being a collection of services of the mobile data, and second channel information describing the transmission frame and the data groups, wherein the second channel information provides an identification number of the ensemble, wherein the ensemble includes a first signaling table describing a service, wherein the first signaling table includes a service map table (SMT) providing Internet Protocol (IP) address information and IP component level information for the service, and wherein the service is signaled by hierarchical signaling information which includes ensemble access information in the second channel information and IP level service access information in the SMT;

building, at a frame builder, the RS frame using the data groups included in the transmission frame; and decoding, at a decoder, the RS frame.

6. The method of claim 5, wherein the SMT includes a flag indicating whether or not the IP address information is an IPv4 address.

7. The method of claim 6, wherein, when the flag is set to 0 (zero), the IP address information is an IPv4 address, and, when the flag is set to 1, the IP address information is an IPv6 address.

8. The method of claim 5, wherein each row of a payload of the RS frame includes a transport packet of the mobile data, the transport packet including an IP datagram having a network time protocol (NTP) timestamp.

9. The method of claim 8, further comprising:

synchronizing presentation of audio and video of the mobile data based on the NTP timestamp.

* * * * *